(12) United States Patent
Luo

(10) Patent No.: US 11,401,465 B2
(45) Date of Patent: Aug. 2, 2022

(54) THERMALLY ACTIVATED DELAYED FLUORESCENT AND SYNTHESIZING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Jiajia Luo, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 652 days.

(21) Appl. No.: 16/475,979

(22) PCT Filed: Nov. 23, 2018

(86) PCT No.: PCT/CN2018/117099
§ 371 (c)(1),
(2) Date: Jul. 3, 2019

(87) PCT Pub. No.: WO2020/037856
PCT Pub. Date: Feb. 27, 2020

(65) Prior Publication Data
US 2020/0318000 A1    Oct. 8, 2020

(30) Foreign Application Priority Data

Aug. 20, 2018 (CN) .................. 201810949560.X

(51) Int. Cl.
*C09K 11/06* (2006.01)
*C08F 212/32* (2006.01)
*H01L 51/00* (2006.01)

(52) U.S. Cl.
CPC ............ *C09K 11/06* (2013.01); *C08F 212/32* (2013.01); *H01L 51/0035* (2013.01);
(Continued)

(58) Field of Classification Search
None
See application file for complete search history.

(56) References Cited

U.S. PATENT DOCUMENTS 9,653,687 B2    5/2017  Ludemann et al.
2020/0318000 A1  10/2020  Luo

FOREIGN PATENT DOCUMENTS

CN         1822410 A    8/2006
CN       103180406 A    6/2013
(Continued)

*Primary Examiner* — Gregory D Clark

(57) ABSTRACT

A thermally activated delayed fluorescent material and a synthesizing method thereof are described. The thermally activated delayed fluorescent material has a structural formula as follows:

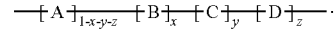

Group A, group B, group C, and group D are all structural groups in the thermally activated delayed fluorescent material, where x, y, and z are molar ratios of the group B, the group C and the group D in the thermally activated delayed fluorescent material, respectively. A white light polymer material with high luminous efficiency is synthesized by using polystyrene as a main chain, and connecting red, green, and blue light-emitting structural units to side chains thereof. An OLED light-emitting layer prepared by using the thermally activated delayed fluorescent material has relatively high lifespan and good light-emitting performance.

17 Claims, 2 Drawing Sheets

(52) U.S. Cl.
CPC .. *H01L 51/0043* (2013.01); *C09K 2211/1416* (2013.01); *C09K 2211/1433* (2013.01); *C09K 2211/1466* (2013.01); *C09K 2211/1475* (2013.01)

(56) References Cited

FOREIGN PATENT DOCUMENTS

| | | | | |
|---|---|---|---|---|
| CN | 105038764 A | 11/2015 | | |
| CN | 107142103 | * 9/2017 | ............ | C09K 11/06 |
| CN | 108864350 A | 11/2018 | | |
| JP | 2006249283 A | 9/2006 | | |
| WO | 2007074499 A1 | 7/2007 | | |

* cited by examiner

THERMALLY ACTIVATED DELAYED FLUORESCENT AND SYNTHESIZING METHOD THEREOF

FIELD OF DISCLOSURE

The present disclosure relates to displays, and more particularly to a thermally activated delayed fluorescent material and a synthesizing method thereof.

BACKGROUND OF DISCLOSURE

Organic light-emitting diodes (OLEDs) have advantages of having a high contrast, thin thickness, wide viewing angles, fast response times, and low energy consumption. They are widely used in display and illumination. Photoelectric conversion efficiency is one of important parameters for evaluating performance of the OLED. In order to improve luminous efficiency of the OLED, various fluorescent-based and phosphorescent-based luminescent materials have been developed. The fluorescent material-based OLED has a high stability, but a ratio of singlet-excited excitons to triplet-excited excitons is 1:3 under electrical activation. An internal electroluminescence quantum efficiency of the fluorescent material is only 25%. As for the phosphorescent material-based OLED, because the phosphorescent material has a spin-orbit coupling effect of heavy atoms, singlet-excited excitons, and triplet-excited excitons can be utilized simultaneously, where a theoretical quantum luminescence efficiency can reach 100%. However, most of the phosphorescent materials use precious metals, which has a relatively high cost and is not environmentally friendly.

In order to solve shortcomings of the above two materials, studies have proposed that the triplet-excited excitons is returned to the singlet state by thermal activation, and then the single-excited excitons are radiated transitionally back to a ground state to luminescence, so that the theoretical internal quantum efficiency reaches 100%. At present, most of the studies are focused on an evaporation type material, which increase manufacturing cost of devices, and polymer thermally activated delayed fluorescent materials have obvious advantages in wet processing due to a good film-forming property. However, a quantum efficiency of the devices prepared by the thermally activated delayed fluorescent polymer material is relatively low. How to make the thermally activated delayed fluorescent polymer maintain a high photoluminescence quantum yield and a large reverse intersystem crossing constant has not been solved.

As described above, the conventional thermally activated delayed fluorescent polymer material has a low photoluminescence quantum yield, and the reverse intersystem crossing constant is relatively small, which leads to a low external quantum efficiency of the light-emitting device prepared using a thermally activated delayed fluorescent polymer material.

SUMMARY OF DISCLOSURE

The present disclosure provides a thermally activated delayed fluorescent material to solve technical problems of influence displays due to a low external quantum efficiency of OLED light-emitting devices induced by a relatively low photoluminescence quantum yield, and a relatively small reverse intersystem crossing constant.

To solve the above problems, a technical solution provided by the present disclosure is as follows:

The present disclosure provides a synthesizing method of a thermally activated delayed fluorescent material, the thermally activated delayed fluorescent material having a structural formula as follows:

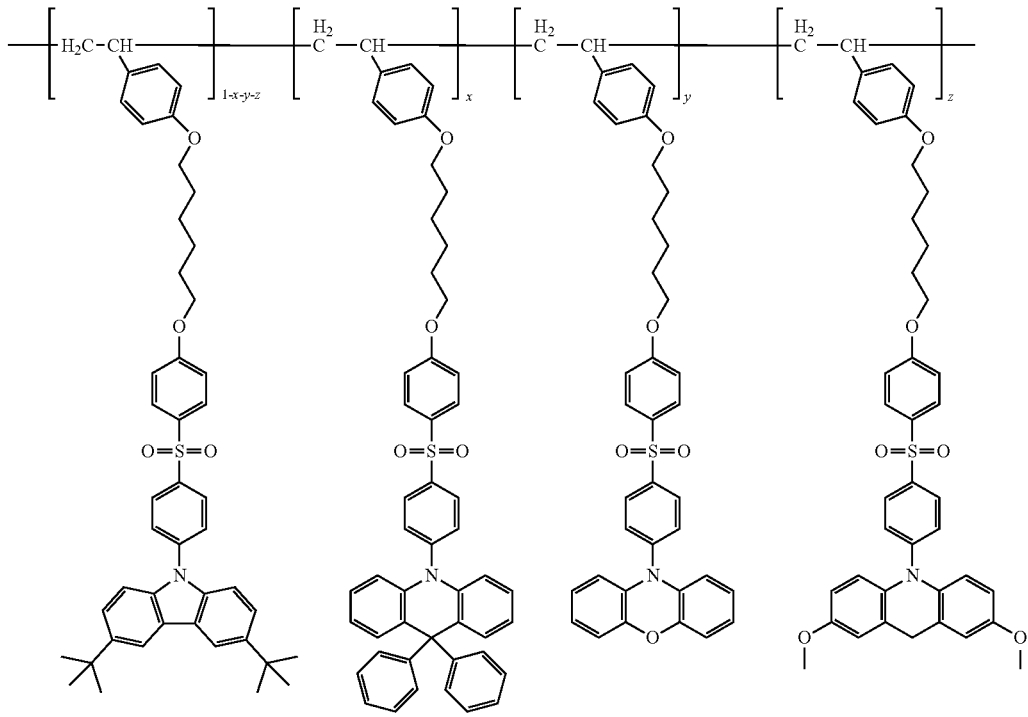

wherein x, y, and z are mole fractions; and the synthesizing method comprising:

a step S10 of performing a heating reaction to a mixture of tert-butylcarbazole, 4-bromo-diphenylsulfone chain styrene, and a first catalyst, and then cooling and separating the mixture of tert-butylcarbazole, 4-bromo-diphenylsulfone chain styrene, and the first catalyst to obtain a first monomer compound, wherein the first monomer compound has a structural formula as follows:

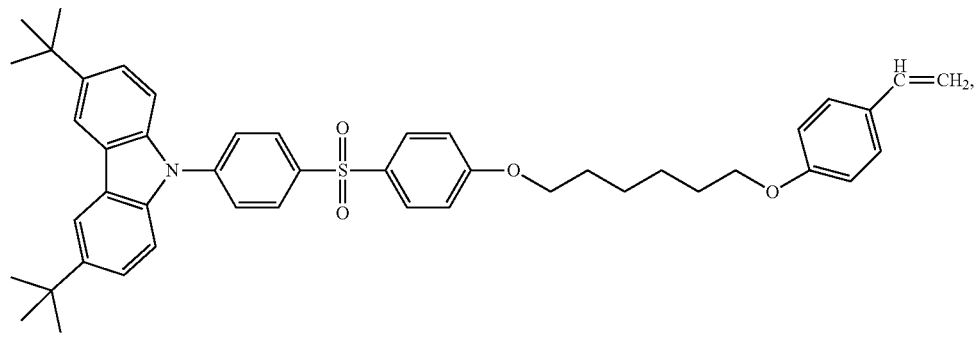 [SMILES: C=Cc1ccc(OCCCCCCOc2ccc(S(=O)(=O)c3ccc(-n4c5ccc(C(C)(C)C)cc5c5cc(C(C)(C)C)ccc54)cc3)cc2)cc1]

wherein the first catalyst is a mixture of cesium carbonate, cuprous iodide, 18-crown-6 ether, and N,N'-dimethylpropylene urea;

a step S20 of performing a heating reaction to a mixture of 9,10-dihydro-9,9-diphenyl acridine, 4-bromo-diphenylsulfone chain styrene, and a second catalyst, cooling the mixture of 9,10-dihydro-9,9-diphenyl acridine, 4-bromo-diphenylsulfone chain styrene, and the second catalyst, and removing impurity therein to obtain a second monomer compound, wherein the second monomer compound has a structural formula as follows:

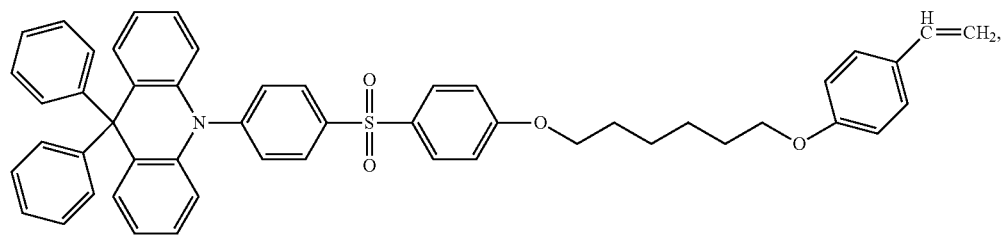 [SMILES: C=Cc1ccc(OCCCCCCOc2ccc(S(=O)(=O)c3ccc(N4c5ccccc5C(c5ccccc5)(c5ccccc5)c5ccccc54)cc3)cc2)cc1]

wherein the second catalyst is a mixture of palladium acetate, tri-tert-butylphosphine tetrafluoroborate, sodium t-butoxide, and toluene; a step S30 of performing a heating reaction to a mixture of phenoxazine, 4-bromo-diphenyl sulfone chain styrene, and the second catalyst, and then cooling and separating the mixture of phenoxazine, the 4-bromo-diphenyl sulfone chain styrene, and the second catalyst to obtain a third monomer compound, wherein the third monomer compound has a structural formula as follows:

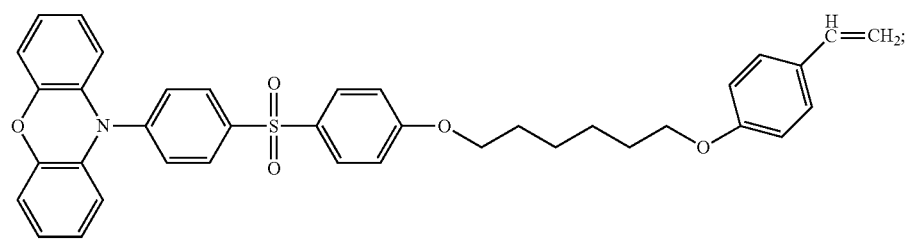 [SMILES: C=Cc1ccc(OCCCCCCOc2ccc(S(=O)(=O)c3ccc(N4c5ccccc5Oc5ccccc54)cc3)cc2)cc1]

a step S40 of performing a heating reaction to a mixture of 3,6-dimethoxyphenoxazine, 4-bromo-diphenylsulfone chain styrene, and the second catalyst, and then cooling and separating the mixture of 3,6-dimethoxyphenoxazine, 4-bromo-diphenylsulfone chain styrene, and the second catalyst to obtain a fourth monomer compound, wherein the fourth monomer compound has a structural formula as follows:

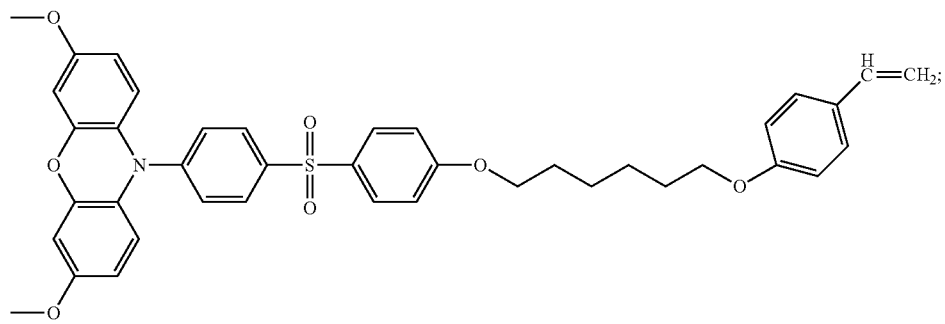 [SMILES: C=Cc1ccc(OCCCCCCOc2ccc(S(=O)(=O)c3ccc(N4c5ccc(OC)cc5Oc5cc(OC)ccc54)cc3)cc2)cc1]

and a step S50 of performing a high pressure reaction to a mixture of the first monomer compound, the second monomer compound, the third monomer compound, the fourth monomer compound, and a third catalyst, and then separating and drying the mixture of the first monomer compound, the second monomer compound, the third monomer compound, the fourth monomer compound, and the third catalyst to obtain the thermally activated delayed fluorescent material.

In at least one embodiment of the present disclosure, the third catalyst is tetrahydrofuran.

In at least one embodiment of the present disclosure, the step S50 comprises:
- a step S501 of mixing the first monomer compound, the second monomer compound, the third monomer compound, the fourth monomer compound, and the third catalyst to obtain a first mixture;
- a step S502 of performing the high pressure reaction to the first mixture to obtain a second mixture;
- a step S503 of precipitating the second mixture with a first solvent to obtain a third mixture;
- a step S504 of extracting the third mixture to obtain a fourth mixture; and a step S505 of vacuum-drying the fourth mixture to obtain the thermally activated delayed fluorescent material.

In at least one embodiment of the present disclosure, the high pressure reaction in the step S502 has a temperature of 65° C., a pressure of 2000 kPa, and a time of 24 hours.

In at least one embodiment of the present disclosure, the first solvent in the step S503 is a mixture of methanol and acetone.

In at least one embodiment of the present disclosure, the step S504 comprises: extracting the third mixture with n-hexane for 72 hours, and then extracting the third mixture with acetone for 72 hours.

The present disclosure further provides a thermally activated delayed fluorescent material, comprising a structural formula as follows:

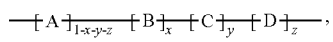

wherein group A, group B, group C, and group D are all structural groups in the thermally activated delayed fluorescent material; and wherein x, y and z are molar ratios of the group B, the group C, and the group D in the thermally activated delayed fluorescent material, respectively; wherein the group A has a structural formula as follows:

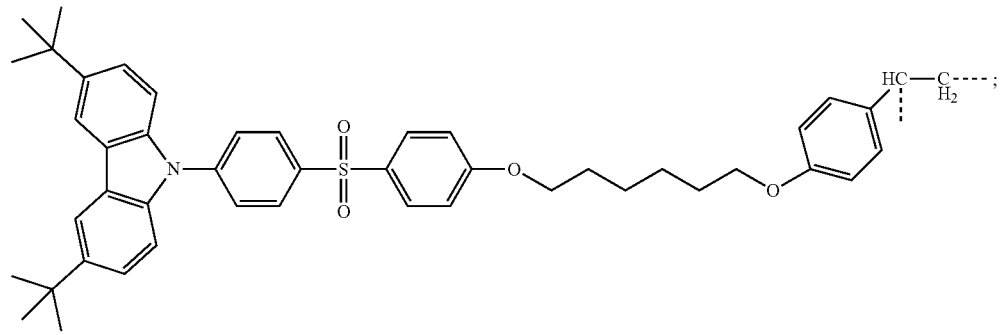

wherein the group B has a structural formula as follows:
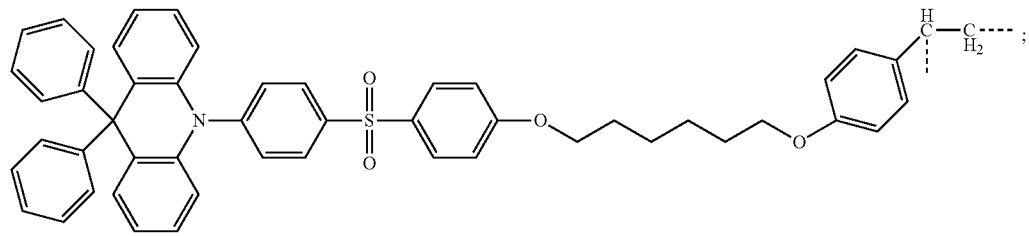
wherein the group C has a structural formula as follows:
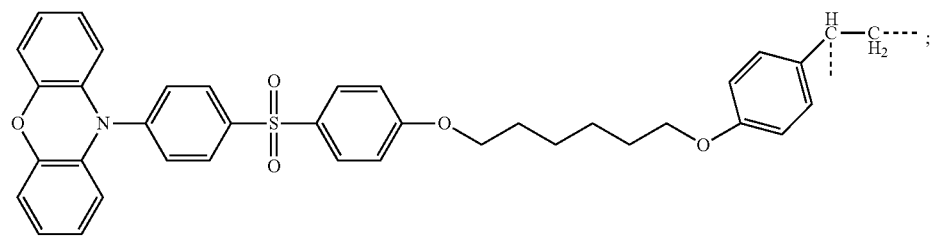
and wherein the group D has a structural formula as follows:
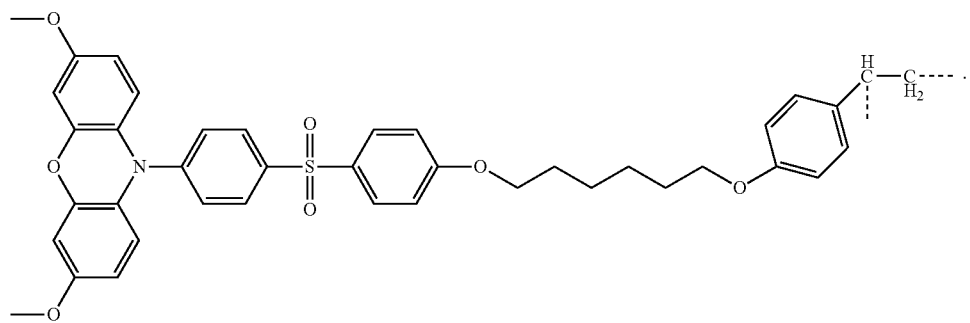

The present disclosure provides another synthesizing method of a thermally activated delayed fluorescent material, the thermally activated delayed fluorescent material having a structural formula as follows:

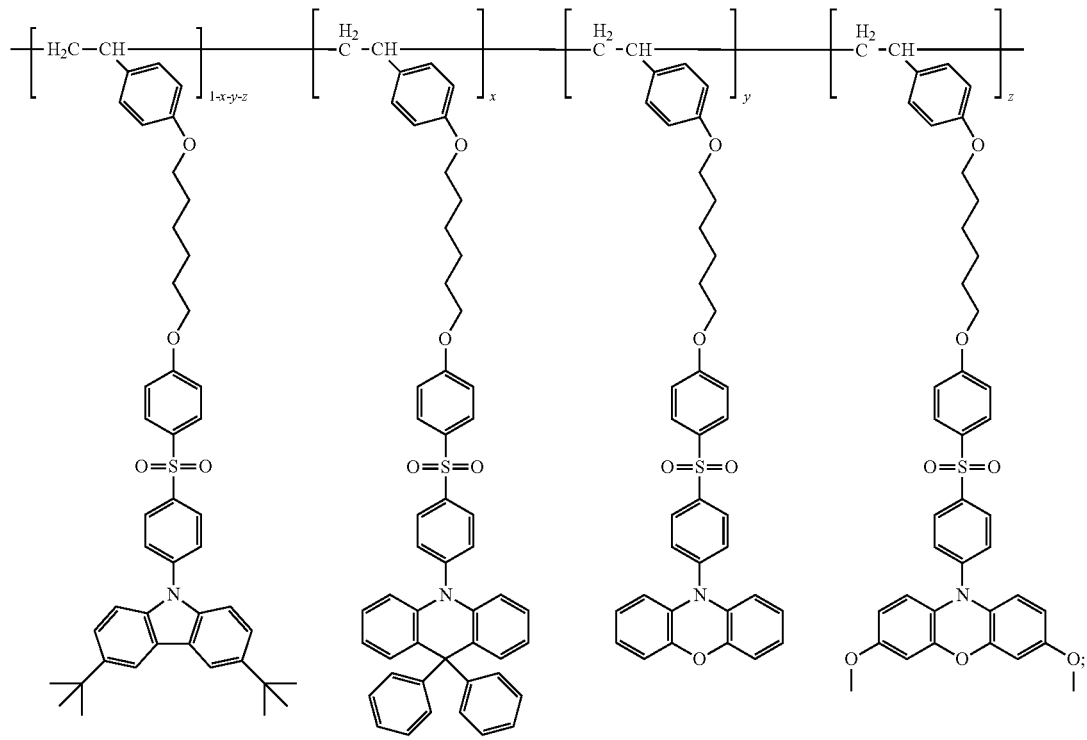

wherein x, y, and z are mole fractions; and the synthesizing method comprising:
a step S10 of performing a heating reaction to a mixture of tert-butylcarbazole, 4-bromo-diphenylsulfone chain styrene, and a first catalyst, and then cooling and separating the mixture of tert-butylcarbazole, 4-bromo-diphenylsulfone chain styrene, and the first catalyst to obtain a first monomer compound, wherein the first monomer compound has a structural formula as follows:

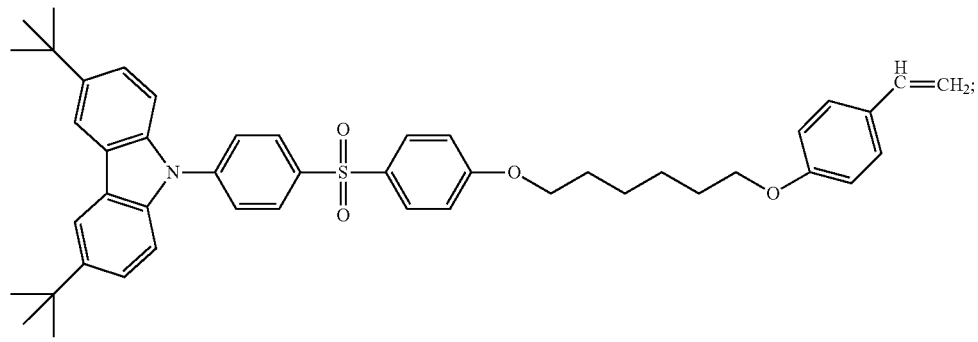 [SMILES: C=Cc1ccc(OCCCCCCOc2ccc(S(=O)(=O)c3ccc(-n4c5ccc(C(C)(C)C)cc5c5cc(C(C)(C)C)ccc54)cc3)cc2)cc1]

a step S20 of performing a heating reaction to a mixture of 9,10-dihydro-9,9-diphenyl acridine, 4-bromo-diphenylsulfone chain styrene, and a second catalyst, cooling the mixture of 9,10-dihydro-9,9-diphenyl acridine, 4-bromo-diphenylsulfone chain styrene, and the second catalyst, and removing impurity therein to obtain a second monomer compound, wherein the second monomer compound has a structural formula as follows:

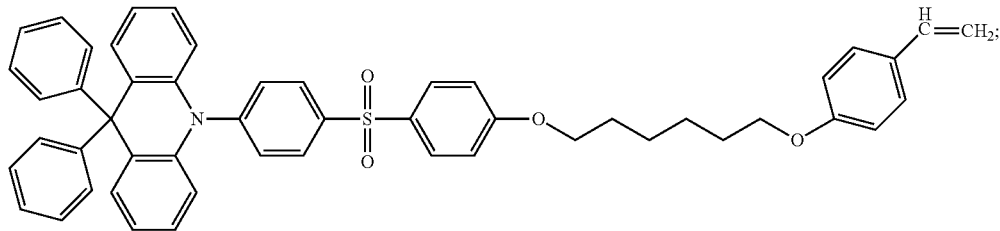 [SMILES: C=Cc1ccc(OCCCCCCOc2ccc(S(=O)(=O)c3ccc(N4c5ccccc5C(c5ccccc5)(c5ccccc5)c5ccccc54)cc3)cc2)cc1]

a step S30 of performing a heating reaction to a mixture of phenoxazine, the 4-bromo-diphenyl sulfone chain styrene, and the second catalyst, and then cooling and separating the mixture of phenoxazine, the 4-bromo-diphenyl sulfone chain styrene, and the second catalyst to obtain a third monomer compound, wherein the third monomer compound has a structural formula as follows:

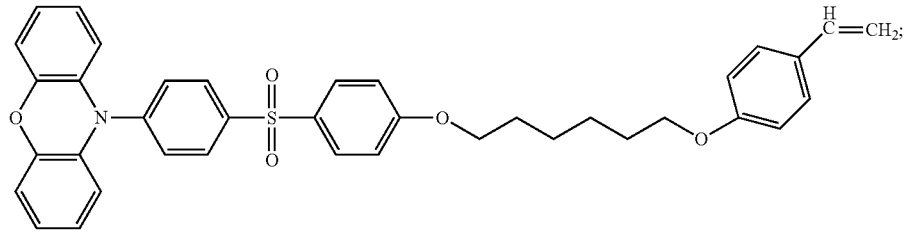 [SMILES: C=Cc1ccc(OCCCCCCOc2ccc(S(=O)(=O)c3ccc(N4c5ccccc5Oc5ccccc54)cc3)cc2)cc1]

a step S40 of performing a heating reaction to a mixture of 3,6-dimethoxyphenoxazine, 4-bromo-diphenylsulfone chain styrene, and the second catalyst, and then cooling and separating the mixture of 3,6-dimethoxyphenoxazine, 4-bromo-diphenylsulfone chain styrene, and the second catalyst to obtain a fourth monomer compound, wherein the fourth monomer compound has a structural formula as follows:

and a step S50 of performing a high pressure reaction to a mixture of the first monomer compound, the second monomer compound, the third monomer compound, the fourth monomer compound, and a third catalyst, and then separating and drying the mixture of the first monomer compound, the second monomer compound, the third monomer compound, the fourth monomer compound, and the third catalyst to obtain the thermally activated delayed fluorescent material.

In at least one embodiment of the present disclosure, the first catalyst is a mixture of cesium carbonate, cuprous iodide, 18-crown-6 ether, and N, N'-dimethylpropylene urea.

In at least one embodiment of the present disclosure, the second catalyst is a mixture of palladium acetate, tri-tert-butylphosphine tetrafluoroborate, sodium t-butoxide, and toluene, and wherein the third catalyst is tetrahydrofuran.

In at least one embodiment of the present disclosure, the heating reaction in the step S10 has a temperature of 180° C. and a reaction time of 24 hours.

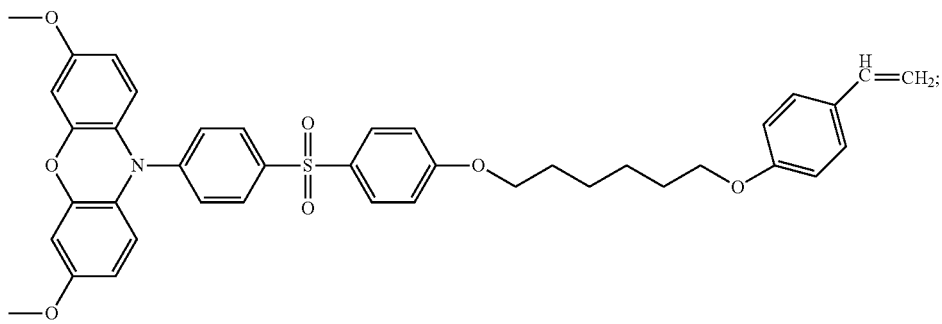 [SMILES: C=Cc1ccc(OCCCCCCOc2ccc(S(=O)(=O)c3ccc(N4c5ccc(OC)cc5Oc5cc(OC)ccc54)cc3)cc2)cc1]

In at least one embodiment of the present disclosure, the heating reaction in the step S20 has a temperature of 110° C. and a reaction time of 24 hours.

In at least one embodiment of the present disclosure, the heating reaction in the step S30 has a temperature of 110° C. and a reaction time of 24 hours.

In at least one embodiment of the present disclosure, the step S50 comprises:
- a step S501 of mixing the first monomer compound, the second monomer compound, the third monomer compound, the fourth monomer compound, and the third catalyst to obtain a first mixture;
- a step S502 of performing the high pressure reaction to the first mixture to obtain a second mixture;
- a step S503 of precipitating the second mixture with a first solvent to obtain a third mixture;
- a step S504 of extracting the third mixture to obtain a fourth mixture; and a step S505 of vacuum-drying the fourth mixture to obtain the thermally activated delayed fluorescent material.

In at least one embodiment of the present disclosure, the high pressure reaction in the step S502 has a temperature of 65° C., a pressure of 2000 kPa, and a time of 24 hours.

In at least one embodiment of the present disclosure, the first solvent in the step S503 is a mixture of methanol and acetone.

In at least one embodiment of the present disclosure, the step S504 comprises: extracting the third mixture with n-hexane for 72 hours, and then extracting the third mixture with acetone for 72 hours.

The disclosure has beneficial effects that a white light polymer material with high luminous efficiency is synthesized by using polystyrene as a main chain, and connecting red, green, and blue light-emitting structural units to side chains thereof. An OLED light-emitting layer prepared by using the thermally activated delayed fluorescent material has relatively high lifespan and good light-emitting performance.

DESCRIPTION OF DRAWINGS

In order to more clearly describe embodiments of the present disclosure or technical solutions in a conventional technology, drawings required to be used for the embodiments or descriptions of the conventional technology are simply described hereinafter. Apparently, the drawings described below only illustrate some embodiments of the present disclosure. Those skilled in the art can obtain other drawings based on these drawings disclosed herein without creative effort.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc. are only directions by referring to the accompanying drawings. Thus, the used directional terms are used to describe and understand the present disclosure, but the present disclosure is not limited thereto. In figures, elements with similar structures are indicated with the same numbers.

The disclosure is directed to the conventional thermally activated delayed fluorescent material. Since a photoluminescence quantum yield of the existing conventional thermally activated delayed fluorescent material is not high and the reverse intersystem crossing constant is relatively small, so that an external quantum efficiency of an OLED light-emitting device prepared by the corresponding polymer material is low, such that influence the technical problems of displays. This present embodiment can solve the drawbacks.

The present disclosure provides a thermally activated delayed fluorescent material, comprising a structural formula as follows:

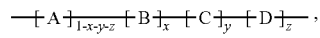

wherein group A, group B, group C, and group D are all structural groups in the thermally activated delayed fluorescent material; and wherein x, y, and z are molar ratios of the group B, the group C, and the group D in the thermally activated delayed fluorescent material, respectively;

wherein the group A has a structural formula as follows:

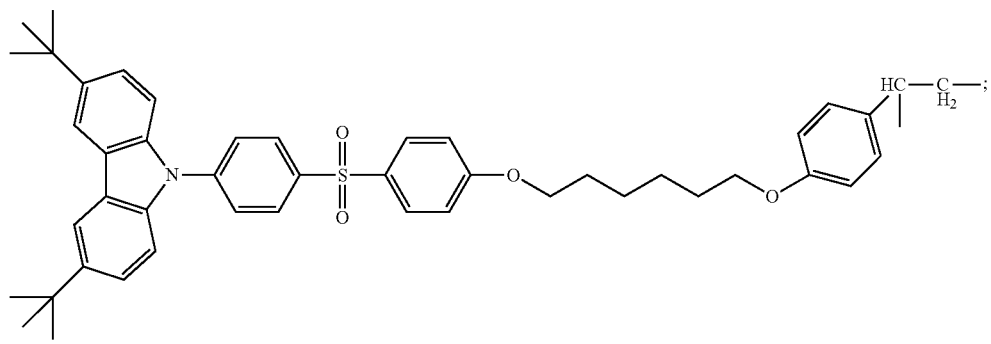

wherein the group B has a structural formula as follows:

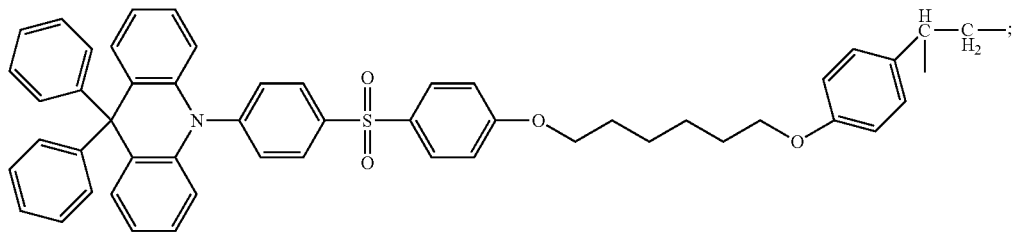

wherein the group C has a structural formula as follows:

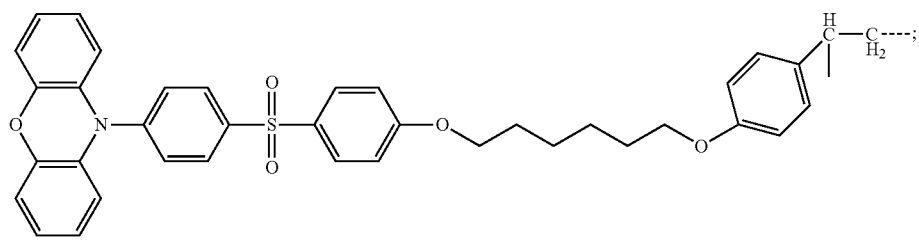

and wherein the group D has a structural formula as follows:

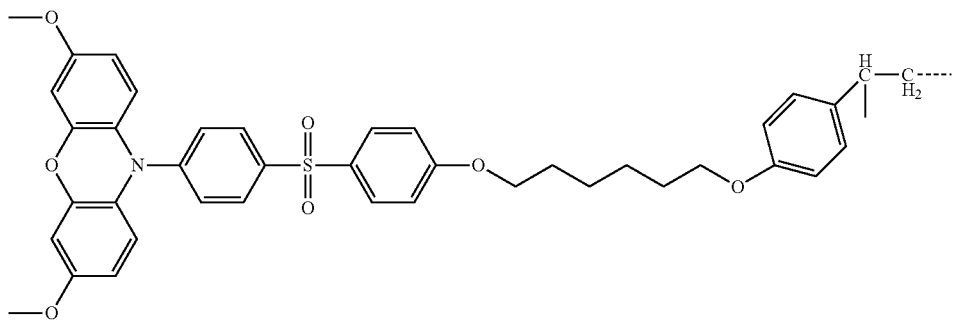

The group B corresponds to a blue light-emitting unit, the group C corresponds to a green light-emitting unit, and the group D corresponds to a red light-emitting unit. A spectrum of the thermally activated delayed fluorescent material is adjusted to achieve chromatographic coordinates of white light by adjusting values of the x, the y, and the z.

Figure 1:
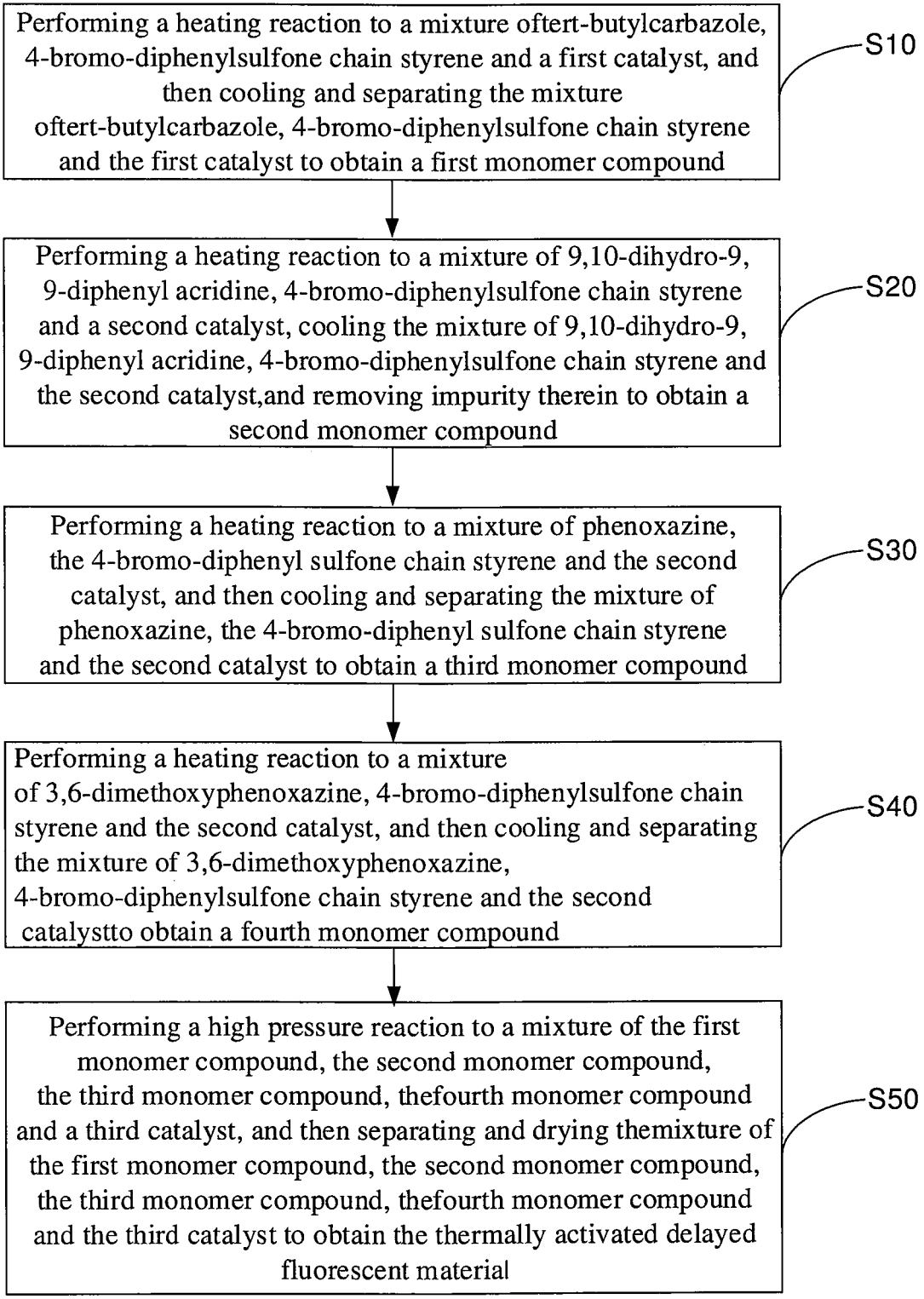
FIG. 1 is a flow chart showing steps of a synthesizing method of a thermally activated delayed fluorescent material of the present disclosure.

As shown in FIG. 1, the present disclosure further provides a synthesizing method of the above thermally activated delayed fluorescent material. In the present embodiment, the thermally activated delayed fluorescent material having a structural formula as follows:

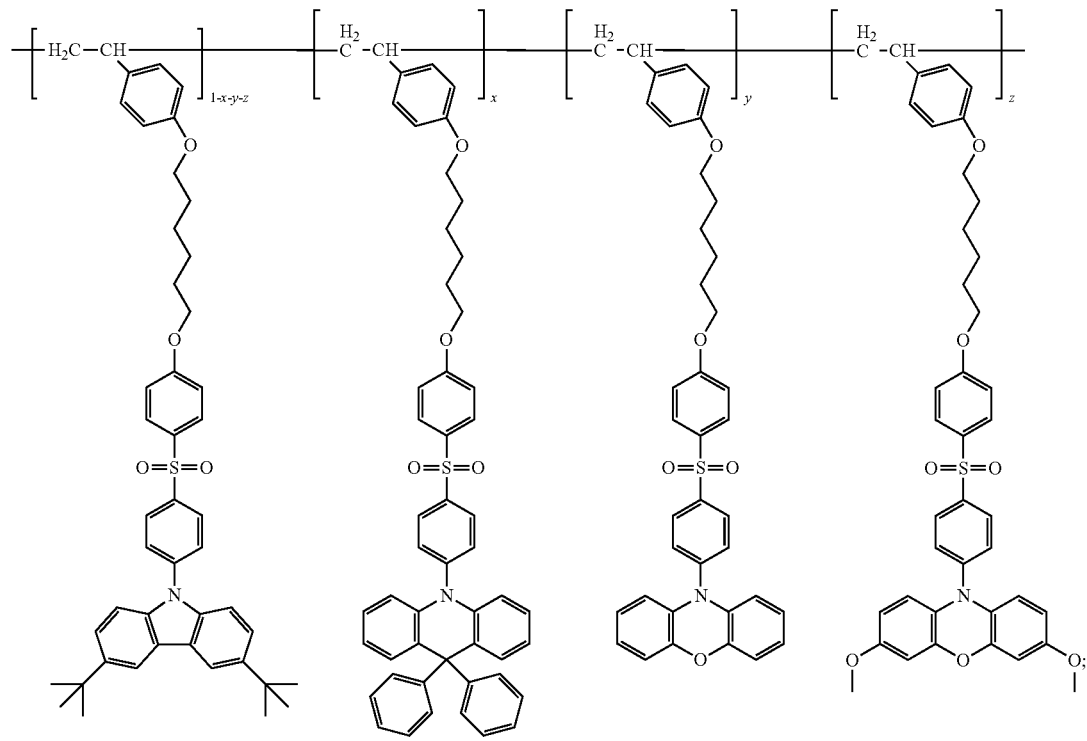

and

The synthesizing method comprises following steps:

In step S10, a heating reaction is performed to a mixture of tert-butylcarbazole, 4-bromo-diphenylsulfone chain styrene, and a first catalyst, and then the mixture of tert-butylcarbazole, 4-bromo-diphenylsulfone chain styrene, and the first catalyst is cooled and separated to obtain a first monomer compound, wherein the first monomer compound has a structural formula as follows:

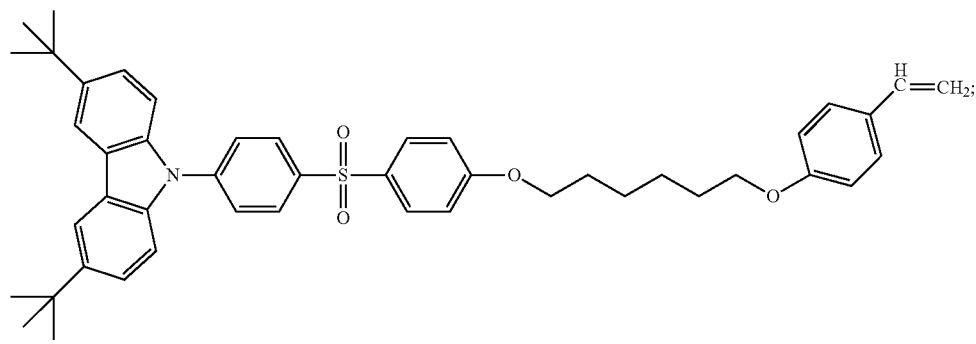 [SMILES: C=Cc1ccc(OCCCCCCOc2ccc(S(=O)(=O)c3ccc(-n4c5ccc(C(C)(C)C)cc5c5cc(C(C)(C)C)ccc54)cc3)cc2)cc1]

wherein the first catalyst is a mixture of cesium carbonate (CsCO₃), cuprous iodide (CuI), 18-crown-6 ether, and N,N'-dimethylpropylene urea (DMPU).

A synthesizing route of the first monomer compound is as follows:

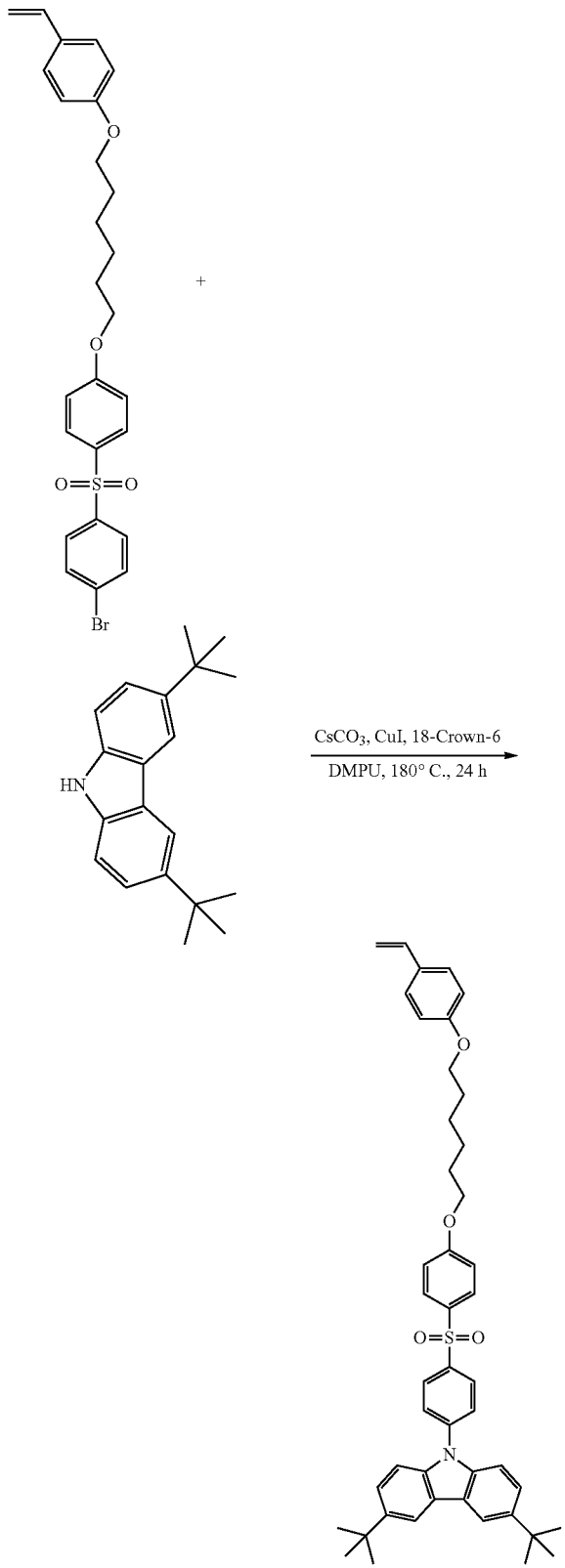

First, a first container, such as a 100 ml two-neck bottle, is provided. Tert-butylcarbazole (2.79 g, 10 mmol), 4-bromo-diphenylsulfone chain styrene (5.14 g, 10 mmol), CsCO₃ (2.31 g, 12 mmol), CuI (0.11 g, 0.6 mmol), and 18-Crown-6 ether (52 mg, 0.2 mmol) are added into the first container. Then, three times of vacuuming are performed, and argon gas is introduced to prevent water and oxygen in the air from affecting the reaction. Thereafter, 20 ml of N,N-dimethylpropenylurea previously removed from oxygen is added to the first container. The first container is then heated to a temperature of 180° C. and maintained at a constant temperature, and reacted at this temperature for 24 hours. Then, a first reaction liquid is obtained by cooling to room temperature. The reaction liquid is added to 200 ml of ice water, and suction filtration is carried out to obtain a grayish-white solid. The grayish-white solid is dissolved in dichloromethane and is spun to form a first silica gel. Further, the first silica gel is separated and purified by column chromatography to obtain 4.7 g of a blue-white powder in a yield of 66%, wherein an eluting agent used in the column chromatography includes dichloromethane and n-hexane with a volume ratio being 1:3. Finally, the blue-white powder is purified by a sublimation instrument to obtain the first monomer compound.

Nuclear magnetic resonance spectroscopy of the first monomer compound is measured by using a nuclear magnetic resonance apparatus with an alternating frequency conversion rate of 300 Hz and a deuterated reagent of deuterated methylene chloride. The first monomer compound has a singlet peak and 2 hydrogens at a chemical shift of 8.89 ppm, doublet peaks and 2 hydrogens at a chemical shift of 8.37 ppm, doublet peaks and 2 hydrogens at a chemical shift of 8.18 ppm, doublet peaks and 2 hydrogens at a chemical shift of 7.93 ppm, multiple peaks and 2 hydrogens at a chemical shift ranging from 7.60 to 7.53 ppm, multiple peaks and 2 hydrogens at a chemical shift ranging from 7.05 to 7.00 ppm, doublet peaks and 2 hydrogens at a chemical shift of 6.89 ppm, triplet peaks and 2 hydrogens at a chemical shift of 4.03 ppm, multiple peaks and 6 hydrogens at a chemical shift ranging from 1.89 to 1.73 ppm, and multiple peaks and 7 hydrogens at a chemical shift ranging from 1.60 to 1.53 ppm.

An ideal chemical formula of the first monomer compound is $C_{46}H_{51}NO_4S$. A theoretical calculated value of a relative molecular mass is 713.35, and an experimental test value is 713.27, which has a relatively small difference.

A theoretical content of carbon, hydrogen, and nitrogen of the first monomer compound is: 77.38% of carbon, 7.20% of hydrogen, and 1.96% of nitrogen by nuclear magnetic carbon spectrum, mass spectrometry, and elemental analysis. Experimental test values are: 77.28% of carbon, 7.17% of hydrogen, and 1.93% of nitrogen. Compared with the theoretical value, mass content of each element has a relatively small difference.

From the analysis, it is found that the experimentally synthesized first monomer compound is identical to a target monomer compound desired to be synthesized.

In step S20, a heating reaction is performed to a mixture of 9,10-dihydro-9,9-diphenyl acridine, 4-bromo-diphenylsulfone chain styrene, and a second catalyst, and the mixture of 9,10-dihydro-9,9-diphenyl acridine, 4-bromo-diphenylsulfone chain styrene, and the second catalyst is cooled and impurity-removed to obtain a second monomer compound, wherein the second monomer compound has a structural formula as follows:

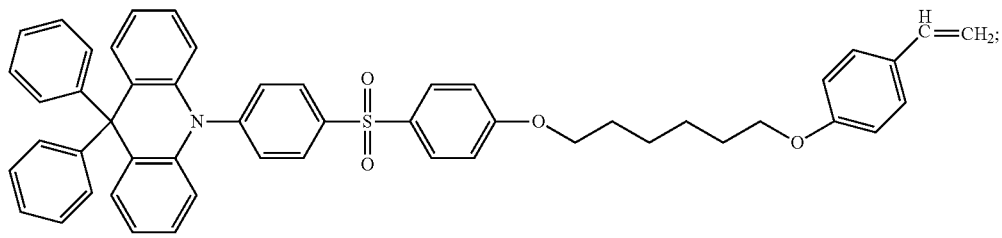 [SMILES: C=Cc1ccc(OCCCCCCOc2ccc(S(=O)(=O)c3ccc(N4c5ccccc5C(c5ccccc5)(c5ccccc5)c5ccccc54)cc3)cc2)cc1]

wherein the second catalyst is a mixture of palladium acetate (Pd(OAc)$_2$), tri-tert-butylphosphine tetrafluoroborate([(t-Bu)$_3$P]HBF$_4$), sodium t-butoxide (NaOt-Bu), and toluene (TOL).

A synthesizing route of the second monomer compound is as follows:

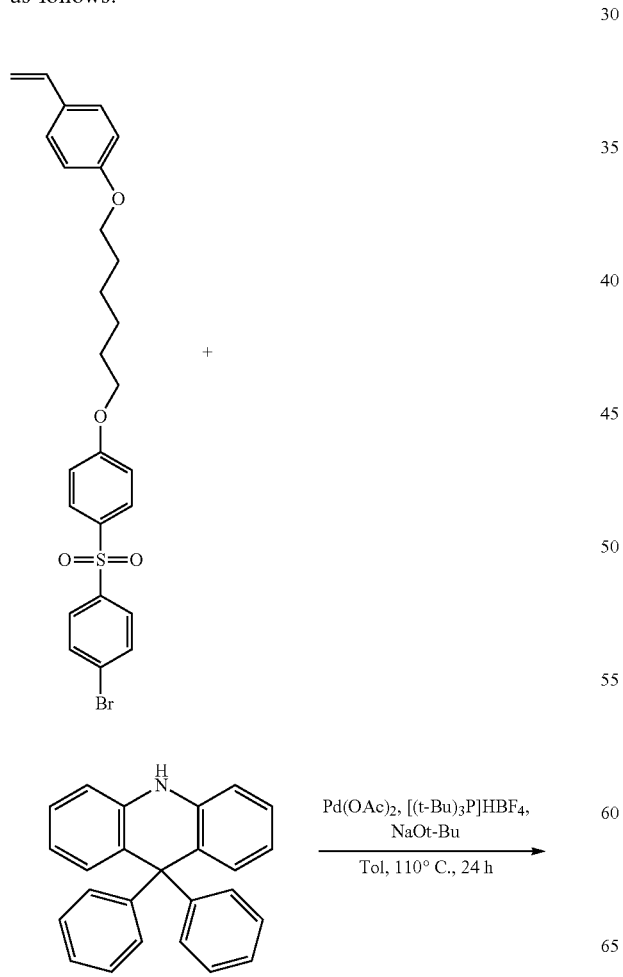

-continued

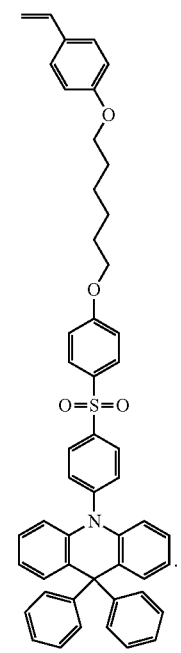

First, a second container, such as a 100 ml two-neck bottle, is provided. 9,10-dihydro-9,9-diphenyl acridine (4.00 g, 12 mmol), 4-bromo-diphenylsulfone chain styrene (5.14 g, 10 mmol), palladium acetate (90 mg, 10 mmol), and tri-tert-butylphosphine tetrafluoroborate (0.34 g, 1.2 mmol) are added into the second container. Then, the second container is placed in a glove box filled with a protective gas, and the protective gas is one of nitrogen or an inert gas. Thereafter, toluene (1.12 g, 12 mmol) which water and oxygen is previously removed is added to the second container. NaOt-Bu is added thereto after the second container is placed in the glove box, due to NaOt-Bu being sensitive to water and oxygen. The second container is then heated to a temperature of 110° C. and maintained at a constant temperature, and reacted at this temperature for 24 hours. Then, a second reaction liquid is obtained by cooling to room temperature. The second reaction liquid is added to 50 ml of ice water and is extracted three times with dichloromethane to obtain an organic phase. The organic phase is spun into a second silica gel. The second silica gel is separated and purified by column chromatography to obtain 4.3 g of a light blue powder in a yield of 56%, wherein dichloromethane and n-hexane used in the column chromatography has a volume ratio of 1:5. Finally, the light blue powder is purified by a sublimation instrument to obtain 2.5 grams of the second monomer compound.

Nuclear magnetic resonance spectroscopy of the second monomer compound is measured by using a nuclear magnetic resonance apparatus with an alternating frequency conversion rate of 300 Hz and a deuterated reagent of deuterated methylene chloride. The second monomer compound has doublet peaks and 2 hydrogens at a chemical shift of 8.96 ppm, doublet peaks and 2 hydrogens at a chemical shift of 8.78 ppm, doublet peaks and 2 hydrogens at a chemical shift of 8.53 ppm, doublet peaks and 2 hydrogens at a chemical shift of 8.23 ppm, multiple peaks and 2 hydrogens at a chemical shift of 7.98 ppm, multiple peaks and 2 hydrogens at a chemical shift of 7.72 ppm, multiple peaks and 12 hydrogens at a chemical shift ranging from 7.36 to 7.08 ppm, multiple peaks and 4 hydrogens at a chemical shift ranging from 6.96 to 6.84 ppm, triplet peaks and 2 hydrogens at a chemical shift of 4.02 ppm, multiple peaks and 6 hydrogens at a chemical shift ranging from 1.88 to 1.76 ppm, and multiple peaks and 7 hydrogens at a chemical shift ranging from 1.58 to 1.47 ppm.

An ideal chemical formula of the second monomer compound is $C_{51}H_{45}NO_4S$. A theoretical calculated value of a relative molecular mass is 767.31, and an experimental test value is 767.30, which has a relatively small difference.

A theoretical content of carbon, hydrogen, and nitrogen of the second monomer compound is: 79.76% of carbon, 5.91% of hydrogen, and 1.82% of nitrogen by nuclear magnetic carbon spectrum, mass spectrometry and elemental analysis. Experimental test values are: 79.71% of carbon, 5.87% of hydrogen, and 1.80% of nitrogen. Compared with the theoretical value, mass content of each element has a relatively small difference.

From the analysis, it is found that the experimentally synthesized second monomer compound is identical to a target monomer compound desired to be synthesized.

In step S30, a heating reaction is performed to a mixture of phenoxazine, the 4-bromo-diphenyl sulfone chain styrene, and the second catalyst, and then the mixture of phenoxazine, the 4-bromo-diphenyl sulfone chain styrene and the second catalyst is cooled and separated to obtain a third monomer compound, wherein the third monomer compound has a structural formula as follows:

A synthesizing route of the third monomer compound is as follows:

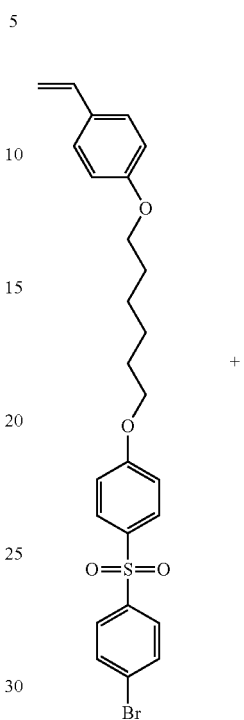

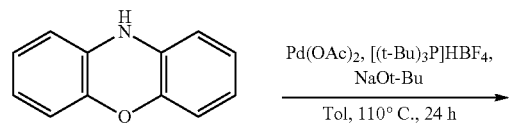

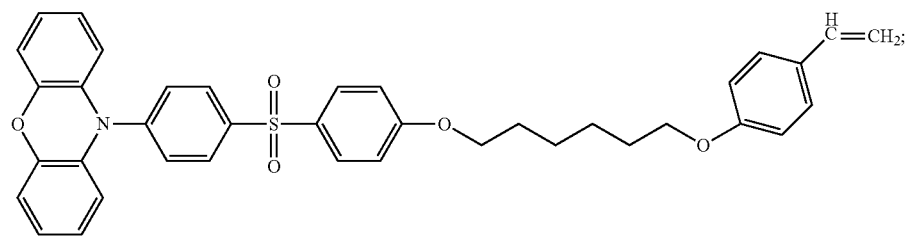 [SMILES: C=Cc1ccc(OCCCCCCOc2ccc(S(=O)(=O)c3ccc(N4c5ccccc5Oc5ccccc54)cc3)cc2)cc1]

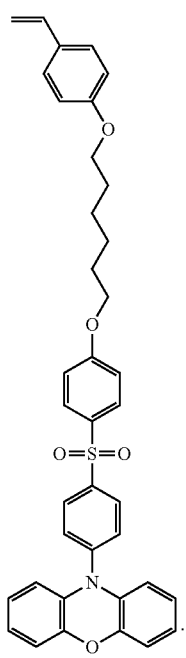

First, a third container, such as a 100 ml two-neck bottle, is provided. Phenoxazine (2.2 g, 12 mmol), 4-bromo-diphenyl sulfone chain styrene (5.14 g, 10 mmol), palladium acetate (90 mg, 10 mmol), and tri-tert-butylphosphine tetrafluoroborate (0.34 g, 1.2 mmol) are added into the third container. Then, the third container is placed in a glove box filled with an argon gas. Further, NaOt-Bu (1.12 g, 12 mmol) is added into the third container. 40 ml of toluene which water and oxygen is previously removed is added to the third container. The third container is then heated to a temperature of 110° C. and maintained at a constant temperature, and reacted at this temperature for 24 hours. Then, a third reaction liquid is obtained by cooling to room temperature. The third reaction liquid is added to 50 ml of ice water and is extracted three times with dichloromethane to obtain an organic phase. The organic phase is spun into a third silica gel. The third silica gel is separated and purified by column chromatography to obtain 3.3 g of a grass green powder in a yield of 53%. Finally, the grass green powder is purified by a sublimation instrument to obtain 2.0 grams of the third monomer compound.

Nuclear magnetic resonance spectroscopy of the third monomer compound is measured by using a nuclear magnetic resonance apparatus with an alternating frequency conversion rate of 300 Hz and a deuterated reagent of deuterated methylene chloride. The third monomer compound has doublet peaks and 2 hydrogens at a chemical shift of 9.13 ppm, doublet peaks and 2 hydrogens at a chemical shift of 8.68 ppm, doublet peaks and 2 hydrogens at a chemical shift of 8.51 ppm, doublet peaks and 2 hydrogens at a chemical shift of 8.13 ppm, multiple peaks and 2 hydrogens at a chemical shift of 7.98 ppm, multiple peaks and 2 hydrogens at a chemical shift ranging from 7.36 to 7.08 ppm, multiple peaks and 6 hydrogens at a chemical shift ranging from 7.36 to 7.08 ppm, multiple peaks and 4 hydrogens at a chemical shift ranging from 6.96 to 6.84 ppm, triplet peaks and 2 hydrogens at a chemical shift of 4.02 ppm, multiple peaks and 6 hydrogens at a chemical shift ranging from 1.88 to 1.76 ppm, and multiple peaks and 7 hydrogens at a chemical shift ranging from 1.58 to 1.47 ppm.

An ideal chemical formula of the third monomer compound is $C_{38}H_{35}NO_5S$. A theoretical calculated value of a relative molecular mass is 617.22, and an experimental test value is 617.20, which has a relatively small difference.

A theoretical content of carbon, hydrogen, and nitrogen of the third monomer compound is: 73.88% of carbon, 5.71% of hydrogen, and 2.27% of nitrogen by nuclear magnetic carbon spectrum, mass spectrometry, and elemental analysis. Experimental test values are: 73.80% of carbon, 5.77% of hydrogen, and 2.20% of nitrogen. Compared with the theoretical value, mass content of each element has a relatively small difference.

From the analysis, it is found that the experimentally synthesized third monomer compound is identical to a target monomer compound desired to be synthesized.

In step S40, a heating reaction is performed to a mixture of 3,6-dimethoxyphenoxazine, 4-bromo-diphenylsulfone chain styrene, and the second catalyst, and then the mixture of 3,6-dimethoxyphenoxazine, 4-bromo-diphenylsulfone chain styrene, and the second catalyst is cooled and separated to obtain a fourth monomer compound, wherein the fourth monomer compound has a structural formula as follows:

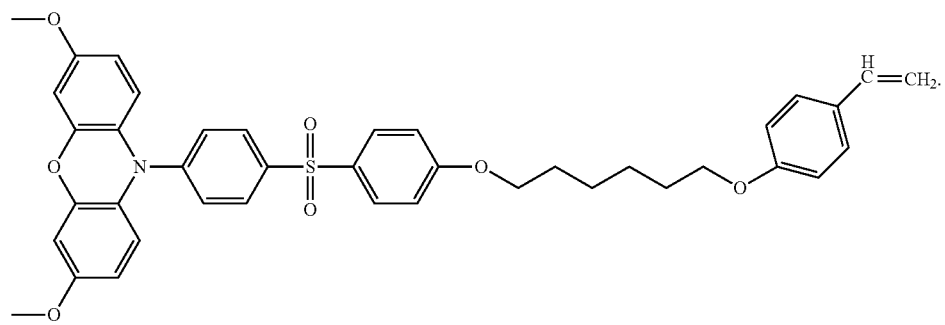 [SMILES: C=Cc1ccc(OCCCCCCOc2ccc(S(=O)(=O)c3ccc(N4c5ccc(OC)cc5Oc5cc(OC)ccc54)cc3)cc2)cc1]

A synthesizing route of the fourth monomer compound is as follows:

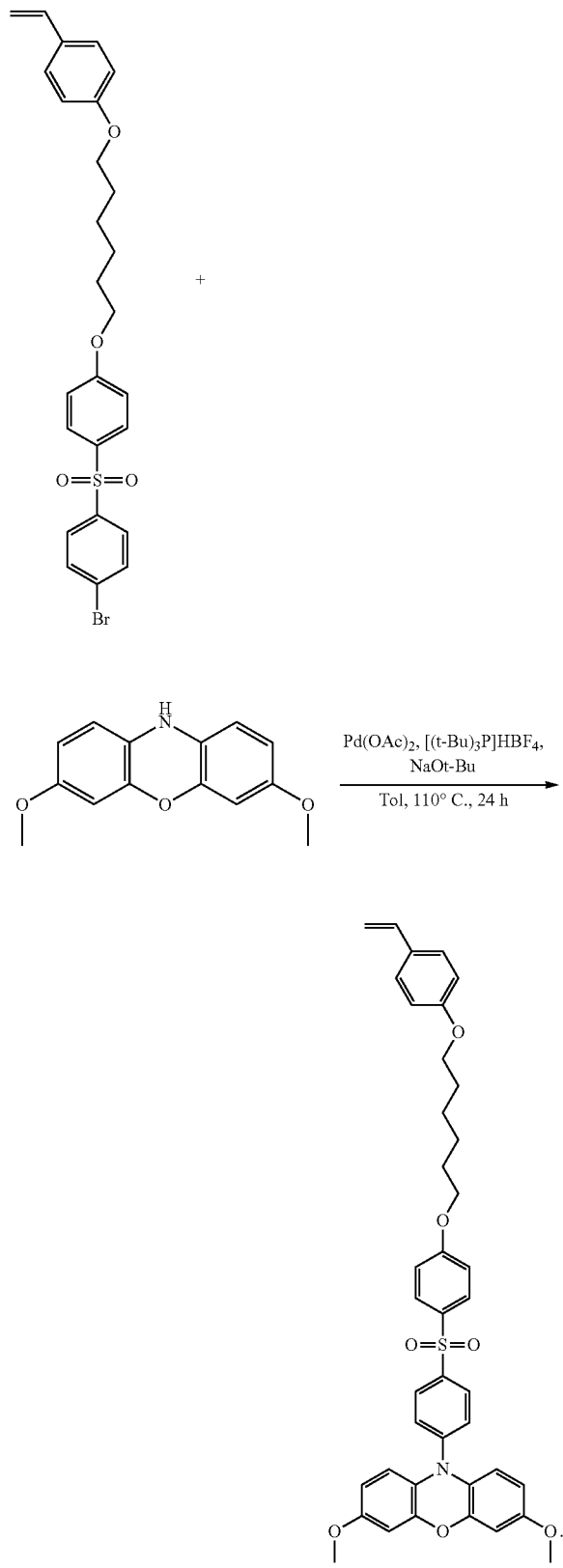

First, a fourth container, such as a 100 ml two-neck bottle, is provided. 3,6-dimethoxyphenoxazine (2.9 g, 12 mmol), 4-bromo-diphenylsulfone chain styrene (5.14 g, 10 mmol), palladium acetate (90 mg, 10 mmol), and tri-tert-butylphosphine tetrafluoroborate (0.34 g, 1.2 mmol). Then, NaOt-Bu (1.12 g, 12 mmol) is added into the fourth container. 40 ml of toluene which water and oxygen is previously removed is added to the fourth container. The fourth container is then heated to a temperature of 110° C. and maintained at a constant temperature, and reacted at this temperature for 24 hours. Then, a fourth reaction liquid is obtained by cooling to room temperature. The fourth reaction liquid is added to 50 ml of ice water and is extracted three times with dichloromethane to obtain an organic phase. The organic phase is spun into a third silica gel. The third silica gel is separated and purified by column chromatography to obtain 2.8 g of a light red powder in a yield of 41%. Finally, the light red powder is purified by a sublimation instrument to obtain 1.53 grams of the fourth monomer compound.

Nuclear magnetic resonance spectroscopy of the fourth monomer compound is measured by using a nuclear magnetic resonance apparatus with an alternating frequency conversion rate of 300 Hz and a deuterated reagent of deuterated methylene chloride. The fourth monomer compound has a singlet peak and 2 hydrogens at a chemical shift of 9.23 ppm, doublet peaks and 2 hydrogens at a chemical shift of 8.78 ppm, doublet peaks and 2 hydrogens at a chemical shift of 8.53 ppm, doublet peaks and 2 hydrogens at a chemical shift of 8.13 ppm, multiple peaks and 2 hydrogens at a chemical shift of 7.98 ppm, multiple peaks and 4 hydrogens at a chemical shift ranging from 7.36 to 7.08 ppm, multiple peaks and 6 hydrogens at a chemical shift ranging from 7.36 to 7.08 ppm, multiple peaks and 4 hydrogens at a chemical shift ranging from 6.96 to 6.84 ppm; triplet peaks and 2 hydrogens at a chemical shift of 4.02 ppm, multiple peaks and 6 hydrogens at a chemical shift ranging from 1.88 to 1.76 ppm, and multiple peaks and 7 hydrogens at a chemical shift ranging from 1.58 to 1.47 ppm.

An ideal chemical formula of the fourth monomer compound is $C_{40}H_{39}NO_7S$. A theoretical calculated value of a relative molecular mass is 677.24, and an experimental test value is 677.20, which has a relatively small difference.

A theoretical content of carbon, hydrogen, and nitrogen of the fourth monomer compound is 70.88% of carbon, 5.80% of hydrogen, and 2.07% of nitrogen by nuclear magnetic carbon spectrum, mass spectrometry, and elemental analysis. Experimental test values are: 70.96% of carbon, 5.77% of hydrogen, and 2.00% of nitrogen. Compared with the theoretical value, mass content of each element has a relatively small difference.

From the analysis, it is found that the experimentally synthesized fourth monomer compound is identical to a target monomer compound desired to be synthesized.

In step S50, a high pressure reaction is performed to a mixture of the first monomer compound, the second monomer compound, the third monomer compound, the fourth monomer compound, and a third catalyst, and then the mixture of the first monomer compound, the second monomer compound, the third monomer compound, the fourth monomer compound, and the third catalyst is separated and dried to obtain the thermally activated delayed fluorescent material, wherein the third catalyst is tetrahydrofuran.

A synthesizing route of the polymer material is as follows:
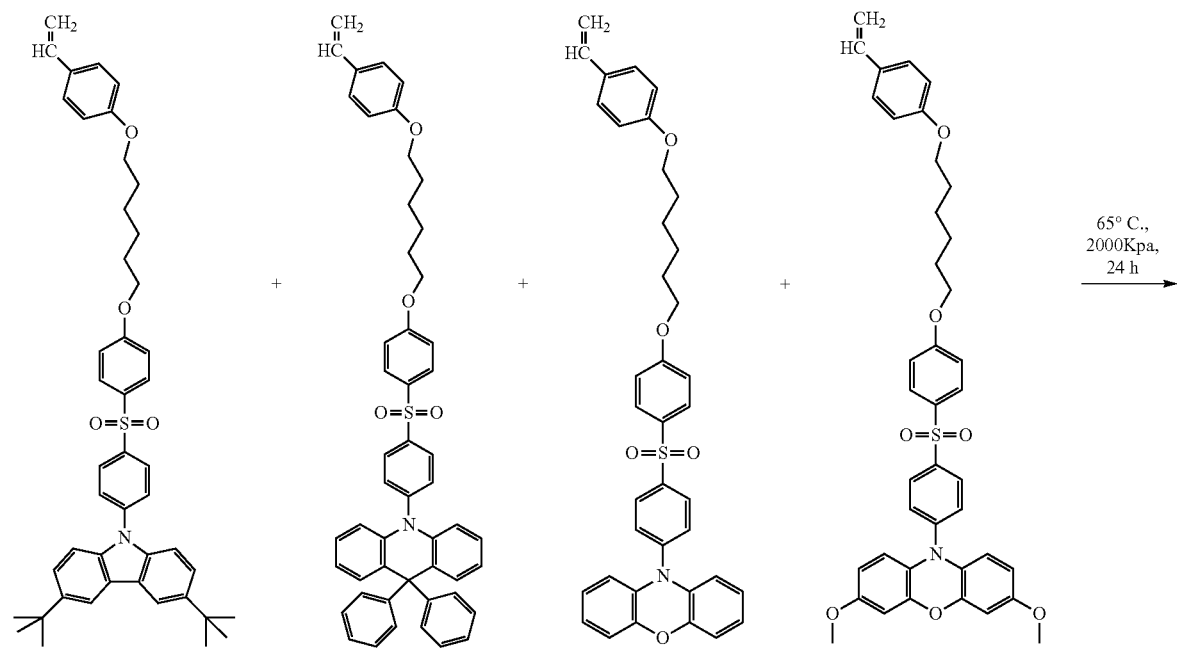
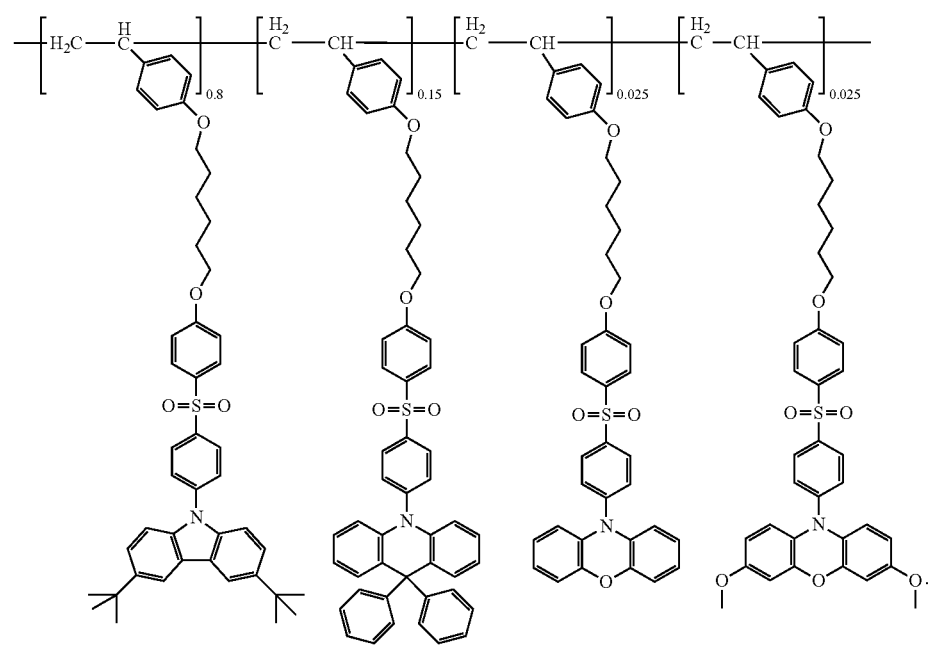

First, a 200 ml high pressure reaction flask is provided. A first monomer compound (1.14 g, 1.6 mmol), a second monomer compound (0.23 g, 0.3 mmol), a third monomer compound (30.8 mg, 0.05 mmol), and a fourth monomer compound (33.8 mg, 0.05 mmol) are added into the 200 ml high pressure reaction flask, and 50 ml of tetrahydrofuran is further added thereto to obtain a first mixture. Further, the first mixture is placed in an environment of 65° C. and 2000 kPa. After reacting for 24 hours, a second mixture is obtained by cooling to room temperature. Further, the second mixture is precipitated with a first solvent to obtain a third mixture, wherein the first solvent is a mixture of methanol and acetone. The methanol is 250 ml, and the acetone is 30 ml. The third mixture is extracted with n-hexane for 72 hours and then extracted with acetone for 72 hours to obtain a fourth mixture. Then, the fourth mixture is vacuum-dried to obtain a white flocculent polymer, i.e., the polymer material, which has a weight of 0.98 g and a yield of 68%. The polymer has a number average molecular weight of 376 kg/mol, a weight average molecular weight of 583 g/mol, and a Polymer Dispersity Index (PDI) of 1.55, wherein a ratio of the weight average molecular weight and the number average molecular weight is referred to a polydispersity index and has a value greater than 1. The larger the PDI, the wider the molecular weight distribution. The smaller the PDI, the more uniform the molecular weight distribution.

Figure 2:
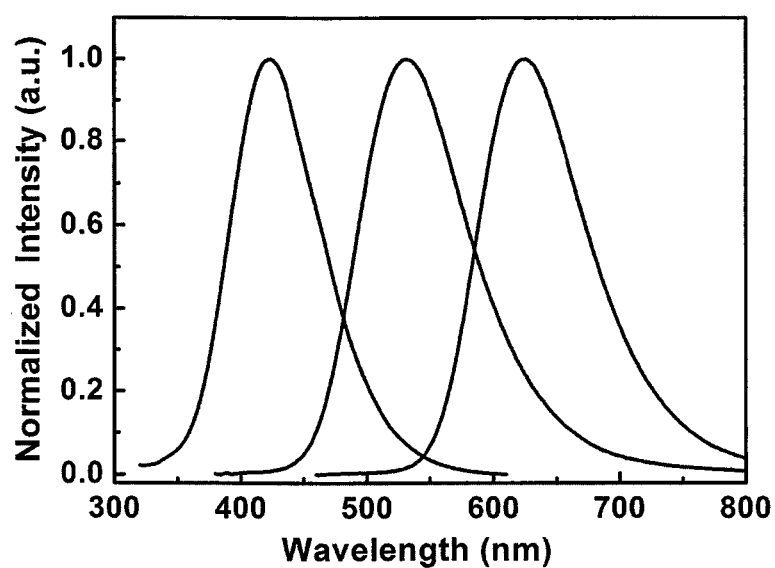
FIG. 2 is a photoluminescence spectrum of a second monomer compound, a third monomer compound, and a fourth monomer compound of the present disclosure.

As shown in FIG. 2, FIG. 2 is a photoluminescence spectrum of a second monomer compound, a third monomer compound, and a fourth monomer compound of the present disclosure. Curves from left to right in the figure are photoluminescence spectrum curves of the second monomer compound, the third monomer compound, and the fourth monomer compound.

A lowest singlet state energy level of the second monomer compound is 2.89 eV, and a lowest triplet state energy level is 2.82 eV, which has a small singlet-triplet state energy level difference, and triplet state excitons can pass back to a singlet state through the reverse intersystem crossing. The photoluminescence spectrum of the second monomer compound at room temperature has a peak of light intensity near a wavelength of 435 nm, and the wavelength of blue light is 435-450 nm, which indicates that the second monomer compound controls the blue light emitting unit in the synthesized polymer material.

A lowest singlet state energy level of the third monomer compound is 2.35 eV, and a lowest triplet state energy level is 2.30 eV, which has a small singlet-triplet state energy level difference, and triplet state excitons can pass back to a singlet state through the reverse intersystem crossing. The photoluminescence spectrum of the third monomer compound at room temperature has a peak of light intensity near a wavelength of 530 nm, and the wavelength of green light is 492-577 nm, which indicates that the third monomer compound controls the green light emitting unit in the synthesized polymer material.

A lowest singlet state energy level of the fourth monomer compound is 2.35 eV, and a lowest triplet state energy level is 1.98 eV, which has a small singlet-triplet state energy level difference, and triplet state excitons can pass back to a singlet state through the reverse intersystem crossing. The photoluminescence spectrum of the fourth monomer compound at room temperature has a peak of light intensity near a wavelength of 640 nm, and the wavelength of red light is 622-760 nm, which indicates that the fourth monomer compound controls the red light emitting unit in the synthesized polymer material.

Figure 3:
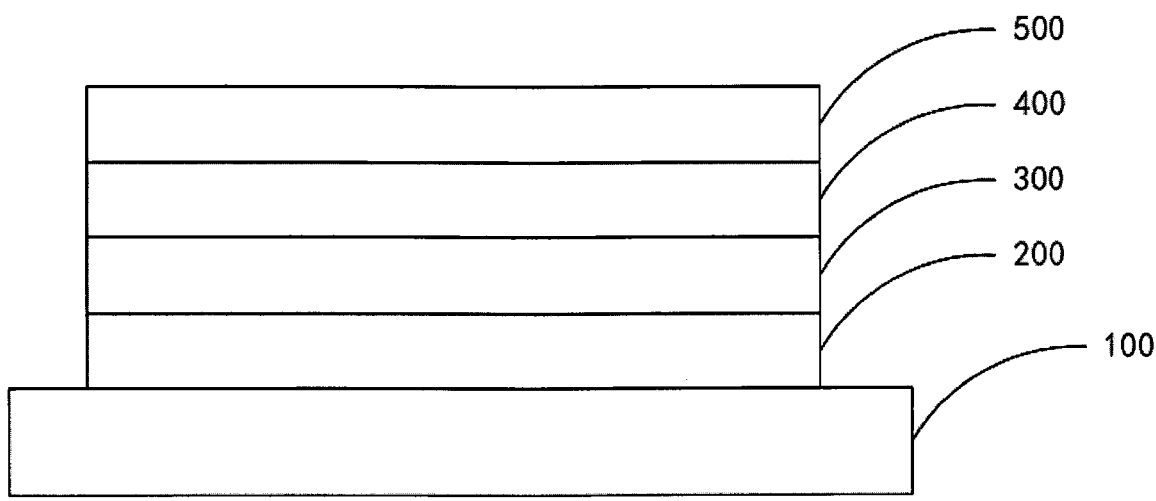
FIG. 3 is a structurally schematic diagram of an OLED light-emitting device of the present disclosure.

As shown in FIG. 3, the present disclosure further provides an OLED light-emitting device comprising a substrate 100, a hole injection transport layer 200, a light emitting layer 300, an electron injection transport layer 400, and a cathode layer 500.

The substrate 100 includes a glass substrate and an anode layer, and the anode layer is made of an indium tin oxide (ITO) material.

The hole injection transport layer 200 is spin-coated on the substrate 100, and the hole injection transport layer 200 is prepared by co-doping with a poly 3,4-ethylenedioxythiophene material and a polystyrene sulfonate material. The hole injection transport layer 200 has a thickness of 50 nm.

The light emitting layer 300 is spin-coated on the hole injection transport layer 200. The light emitting layer 300 is prepared by using the above-mentioned thermally activated delayed fluorescent material or a polymer material synthesized by the above synthesizing method. The luminescent layer 300 has a thickness is 40 nm.

The electron injection transport layer 400 is vacuum-deposited on the light emitting layer 300, and the electron injection transport layer 400 is prepared by using 1,3,5-tris (3-(3-pyridyl)phenyl)benzene material. The electron injection transport layer 400 has a thickness of 40 nm.

The cathode layer 500 is prepared on the electron injection transport layer 400 by vacuum evaporation. The cathode layer 500 is prepared by using an alloy of lithium fluoride and aluminum, wherein the lithium fluoride has a thickness of 1 nm, and the aluminum has a thickness of 100 nm.

A current-luminance-voltage characteristic measurement is performed on the OLED light-emitting device, the device has a maximum brightness of 2395 cd/m$^2$, a starting voltage of 4.3 V, a maximum external quantum efficiency of 12.3%, and chromatogram coordinates of (0.34, 0.36). The chromatogram coordinates of a general warm white light are (0.33, 0.36).

The present disclosure also provides a display device, including the above OLED light emitting device, which will not be described herein.

A thermally activated delayed fluorescent material and a synthesizing method thereof provided by the present disclosure have beneficial effects that: a white light polymer material with high luminous efficiency is synthesized by using polystyrene as a main chain, and connecting red, green and blue light-emitting structural units to side chains thereof. An OLED light emitting device and a display device prepared by using the thermally activated delayed fluorescent material has relatively high lifespan and good light-emitting performance.

As described above, although the present disclosure has been described in preferred embodiments, they are not intended to limit the disclosure. One of ordinary skill in the art, without departing from the spirit and scope of the disclosure within, can make various modifications and variations, so the range of the scope of the disclosure is defined by the claims.

The invention claimed is:

1. A synthesizing method of a thermally activated delayed fluorescent material, the thermally activated delayed fluorescent material having a structural formula as follows:

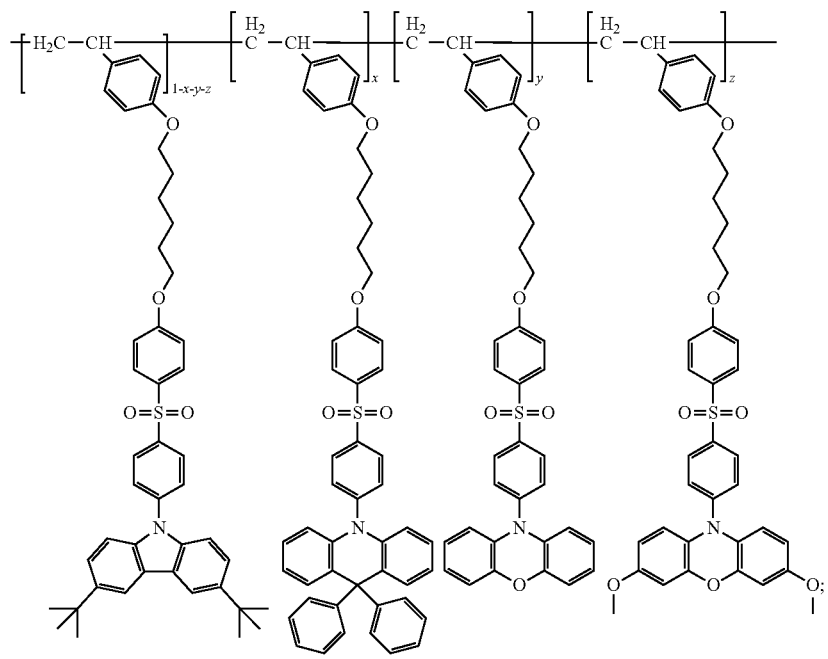

wherein x, y, and z are mole fractions; and the synthesizing method comprising:

a step S10 of performing a heating reaction to a mixture of tert-butylcarbazole, 4-bromo-diphenylsulfone chain styrene, and a first catalyst, and then cooling and separating the mixture of tert-butylcarbazole, 4-bromo-diphenylsulfone chain styrene, and the first catalyst to obtain a first monomer compound, wherein the first monomer compound has a structural formula as follows:

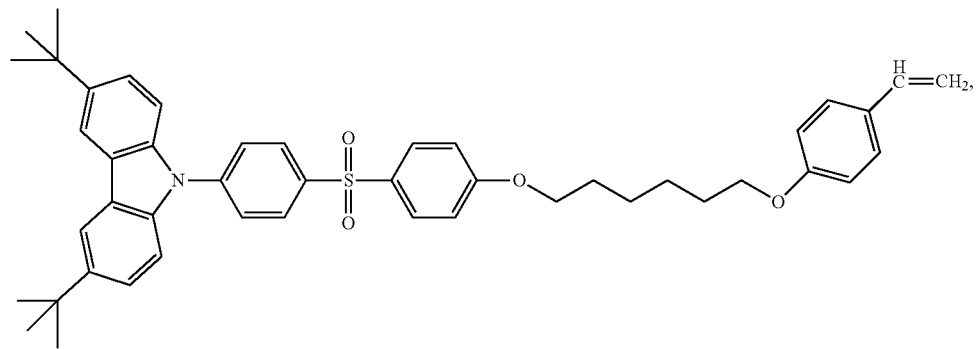 [SMILES: C=Cc1ccc(OCCCCCCOc2ccc(S(=O)(=O)c3ccc(-n4c5ccc(C(C)(C)C)cc5c5cc(C(C)(C)C)ccc54)cc3)cc2)cc1]

wherein the first catalyst is a mixture of cesium carbonate, cuprous iodide, 18-crown-6 ether, and N,N'-dimethylpropylene urea;

a step S20 of performing a heating reaction to a mixture of 9,10-dihydro-9,9-diphenyl acridine, 4-bromo-diphenylsulfone chain styrene, and a second catalyst, cooling the mixture of 9,10-dihydro-9,9-diphenyl acridine, 4-bromo-diphenylsulfone chain styrene, and the second catalyst, and removing impurity therein to obtain a second monomer compound, wherein the second monomer compound has a structural formula as follows:

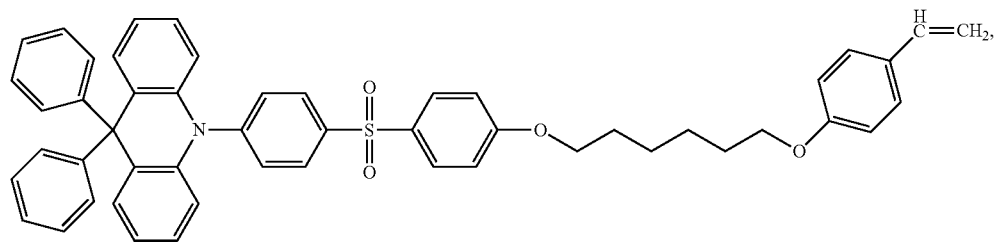 [SMILES: C=Cc1ccc(OCCCCCCOc2ccc(S(=O)(=O)c3ccc(N4c5ccccc5C(c5ccccc5)(c5ccccc5)c5ccccc54)cc3)cc2)cc1]

wherein the second catalyst is a mixture of palladium acetate, tri-tert-butylphosphine tetrafluoroborate, sodium t-butoxide, and toluene;

a step S30 of performing a heating reaction to a mixture of phenoxazine, 4-bromo-diphenyl sulfone chain styrene, and the second catalyst, and then cooling and separating the mixture of phenoxazine, the 4-bromo-diphenyl sulfone chain styrene, and the second catalyst to obtain a third monomer compound, wherein the third monomer compound has a structural formula as follows:

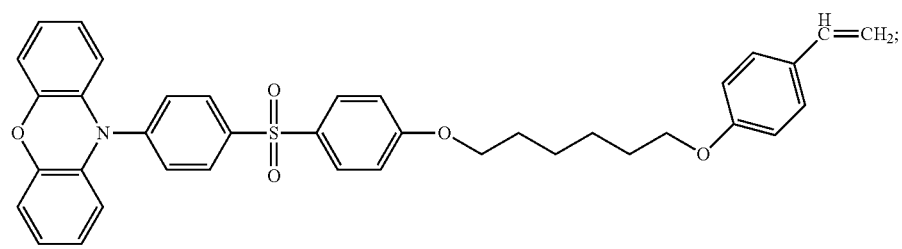 [SMILES: C=Cc1ccc(OCCCCCCOc2ccc(S(=O)(=O)c3ccc(N4c5ccccc5Oc5ccccc54)cc3)cc2)cc1]

a step S40 of performing a heating reaction to a mixture of 3,6-dimethoxyphenoxazine, 4-bromo-diphenylsulfone chain styrene, and the second catalyst, and then cooling and separating the mixture of 3,6-dimethoxyphenoxazine, 4-bromo-diphenylsulfone chain styrene, and the second catalyst to obtain a fourth monomer compound, wherein the fourth monomer compound has a structural formula as follows:

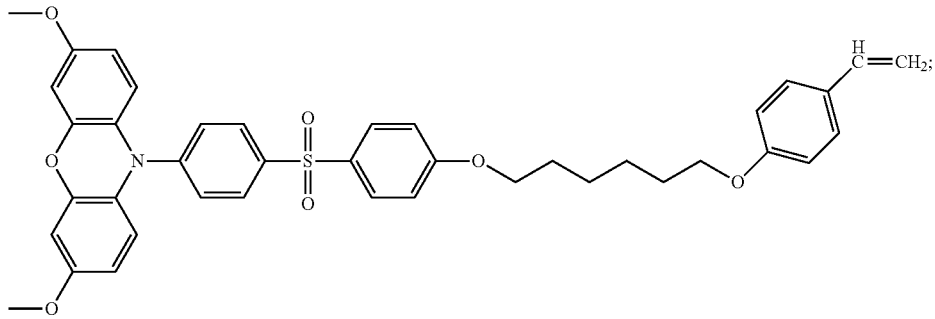 [SMILES: C=Cc1ccc(OCCCCCCOc2ccc(S(=O)(=O)c3ccc(N4c5ccc(OC)cc5Oc5cc(OC)ccc54)cc3)cc2)cc1]

and
- a step S50 of performing a high pressure reaction to a mixture of the first monomer compound, the second monomer compound, the third monomer compound, the fourth monomer compound, and a third catalyst, and then separating and drying the mixture of the first monomer compound, the second monomer compound, the third monomer compound, the fourth monomer compound, and the third catalyst to obtain the thermally activated delayed fluorescent material.

2. The synthesizing method according to claim 1, wherein the third catalyst is tetrahydrofuran.

3. The synthesizing method according to claim 1, wherein the step S50 comprises:
- a step S501 of mixing the first monomer compound, the second monomer compound, the third monomer compound, the fourth monomer compound, and the third catalyst to obtain a first mixture;
- a step S502 of performing the high pressure reaction to the first mixture to obtain a second mixture;
- a step S503 of precipitating the second mixture with a first solvent to obtain a third mixture;
- a step S504 of extracting the third mixture to obtain a fourth mixture; and
- a step S505 of vacuum-drying the fourth mixture to obtain the thermally activated delayed fluorescent material.

4. The synthesizing method according to claim 3, wherein the high pressure reaction in the step S502 has a temperature of 65° C., a pressure of 2000 kPa, and a time of 24 hours.

5. The synthesizing method according to claim 4, wherein the first solvent in the step S503 is a mixture of methanol and acetone.

6. The synthesizing method according to claim 5, wherein the step S504 comprises: extracting the third mixture with n-hexane for 72 hours, and then extracting the third mixture with acetone for 72 hours.

7. A thermally activated delayed fluorescent material, comprising a structural formula as follows:

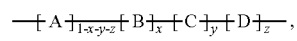

wherein group A, group B, group C, and group D are all structural groups in the thermally activated delayed fluorescent material; and wherein x, y, and z are molar ratios of the group B, the group C, and the group D in the thermally activated delayed fluorescent material, respectively;

wherein the group A has a structural formula as follows:

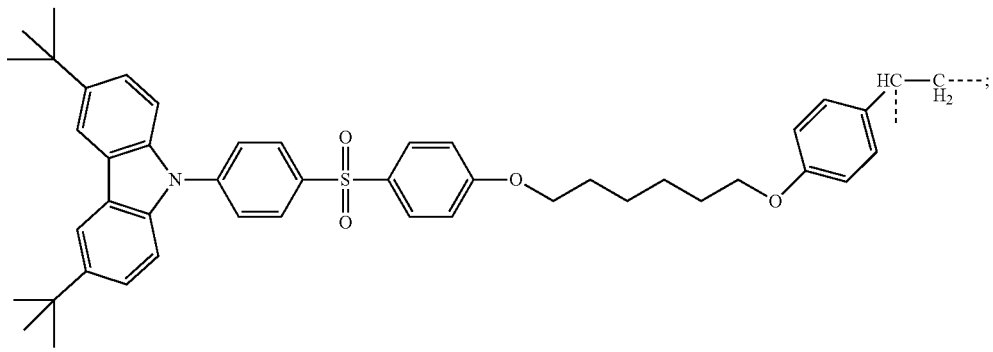

wherein the group B has a structural formula as follows:
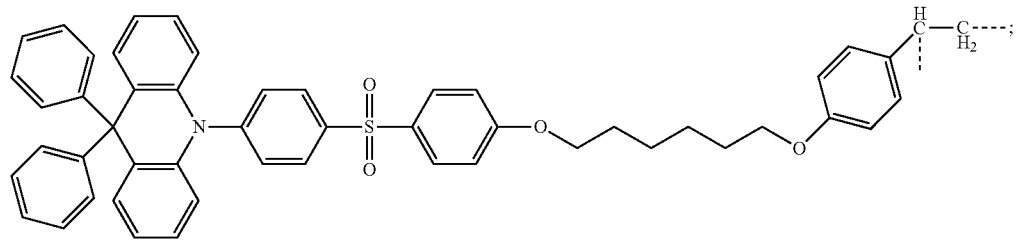
wherein the croup C has a structural formula as follows:
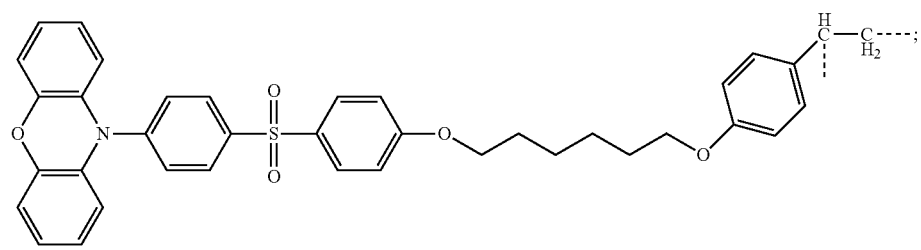
and
wherein the group D has a structural formula as follows:
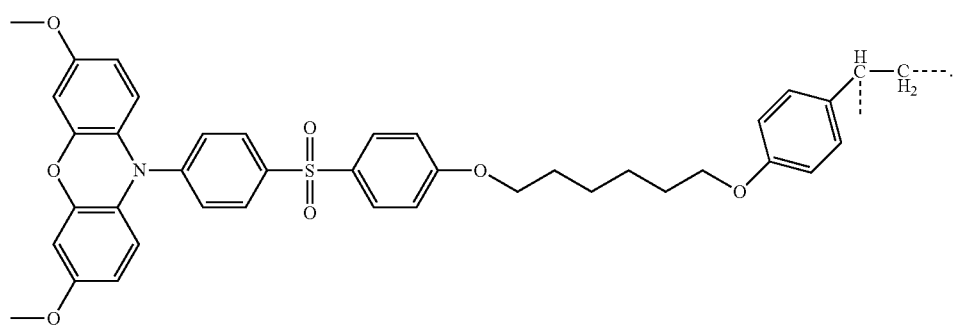

8. A synthesizing method of a thermally activated delayed fluorescent material, the thermally activated delayed fluorescent material having a structural formula as follows:

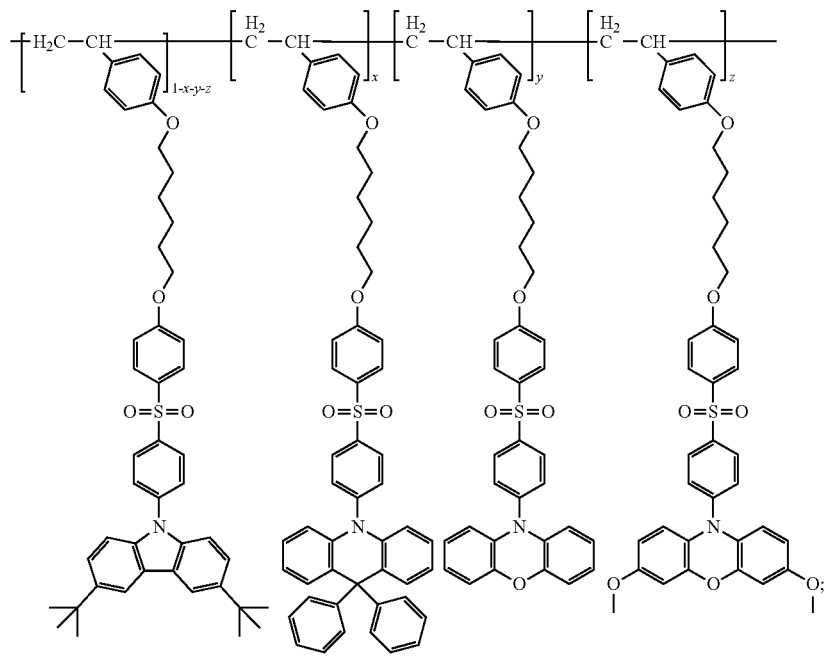

wherein x, y, and z are mole fractions; and the synthesizing method comprising:

a step S10 of performing a heating reaction to a mixture of tert-butylcarbazole, 4-bromo-diphenylsulfone chain styrene, and a first catalyst, and then cooling and separating the mixture of tert-butylcarbazole, 4-bromo-diphenylsulfone chain styrene, and the first catalyst to obtain a first monomer compound, wherein the first monomer compound has a structural formula as follows:

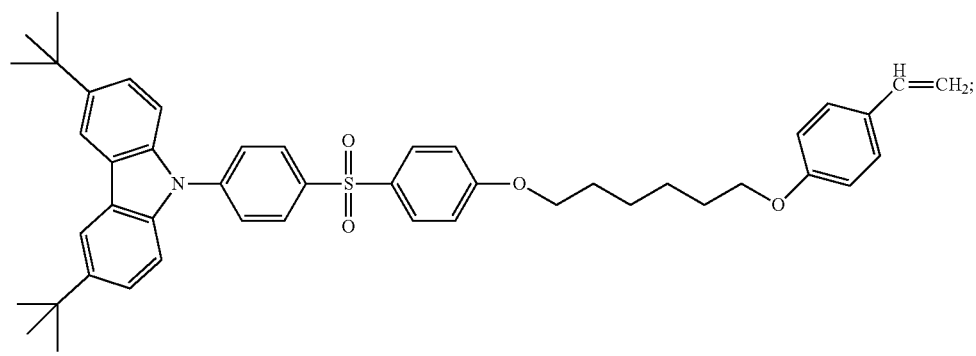 [SMILES: C=Cc1ccc(OCCCCCCOc2ccc(S(=O)(=O)c3ccc(-n4c5ccc(C(C)(C)C)cc5c5cc(C(C)(C)C)ccc54)cc3)cc2)cc1]

a step S20 of performing a heating reaction to a mixture of 9,10-dihydro-9,9-diphenyl acridine, 4-bromo-diphenylsulfone chain styrene, and a second catalyst, cooling the mixture of 9,10-dihydro-9,9-diphenyl acridine, 4-bromo-diphenylsulfone chain styrene, and the second catalyst, and removing impurity therein to obtain a second monomer compound, wherein the second monomer compound has a structural formula as follows:

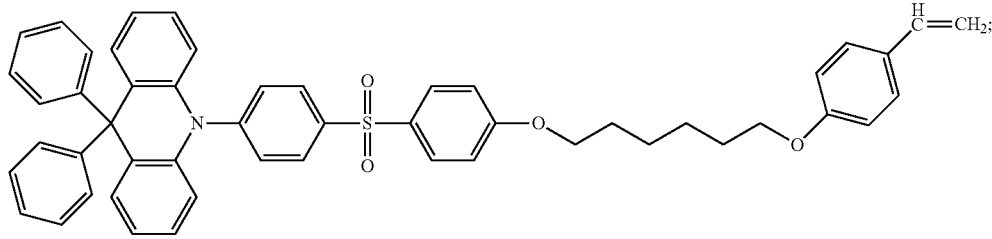 [SMILES: C=Cc1ccc(OCCCCCCOc2ccc(S(=O)(=O)c3ccc(N4c5ccccc5C(c5ccccc5)(c5ccccc5)c5ccccc54)cc3)cc2)cc1]

a step S30 of performing a heating reaction to a mixture of phenoxazine, the 4-bromo-diphenyl sulfone chain styrene, and the second catalyst, and then cooling and separating the mixture of phenoxazine, the 4-bromo-diphenyl sulfone chain styrene, and the second catalyst to obtain a third monomer compound, wherein the third monomer compound has a structural formula as follows:

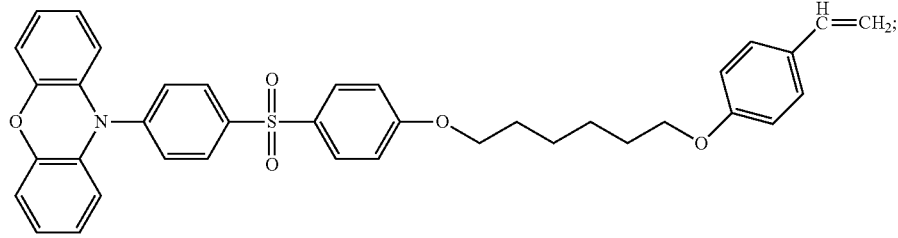 [SMILES: C=Cc1ccc(OCCCCCCOc2ccc(S(=O)(=O)c3ccc(N4c5ccccc5Oc5ccccc54)cc3)cc2)cc1]

a step S40 of performing a heating reaction to a mixture of 3,6-dimethoxyphenoxazine, 4-bromo-diphenylsulfone chain styrene, and the second catalyst, and then cooling and separating the mixture of 3,6-dimethoxyphenoxazine, 4-bromo-diphenylsulfone chain styrene, and the second catalyst to obtain a fourth monomer compound, wherein the fourth monomer compound has a structural formula as follows:

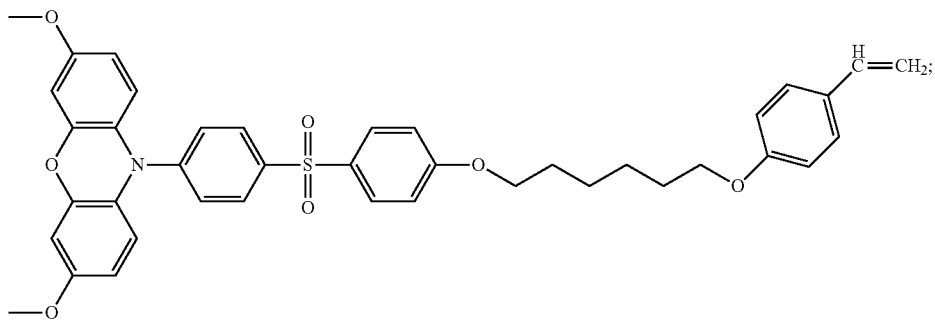 [SMILES: C=Cc1ccc(OCCCCCCOc2ccc(S(=O)(=O)c3ccc(N4c5ccc(OC)cc5Oc5cc(OC)ccc54)cc3)cc2)cc1]

and
a step S50 of performing a high pressure reaction to a mixture of the first monomer compound, the second monomer compound, the third monomer compound, the fourth monomer compound, and a third catalyst, and then separating and drying the mixture of the first monomer compound, the second monomer compound, the third monomer compound, the fourth monomer compound, and the third catalyst to obtain the thermally activated delayed fluorescent material.

9. The synthesizing method according to claim 8, wherein the first catalyst is a mixture of cesium carbonate, cuprous iodide, 18-crown-6 ether, and N, N'-dimethylpropylene urea.

10. The synthesizing method according to claim 8, wherein the second catalyst is a mixture of palladium acetate, tri-tert-butylphosphine tetrafluoroborate, sodium t-butoxide, and toluene, and wherein the third catalyst is tetrahydrofuran.

11. The synthesizing method according to claim 8, wherein the heating reaction in the step S10 has a temperature of 180° C. and a reaction time of 24 hours.

12. The synthesizing method according to claim 8, wherein the heating reaction in the step S20 has a temperature of 110° C. and a reaction time of 24 hours.

13. The synthesizing method according to claim 8, wherein the heating reaction in the step S30 has a temperature of 110° C. and a reaction time of 24 hours.

14. The synthesizing method according to claim 8, wherein the step S50 comprises:
a step S501 of mixing the first monomer compound, the second monomer compound, the third monomer compound, the fourth monomer compound, and the third catalyst to obtain a first mixture;

a step S502 of performing the high pressure reaction to the first mixture to obtain a second mixture;

a step S503 of precipitating the second mixture with a first solvent to obtain a third mixture;

a step S504 of extracting the third mixture to obtain a fourth mixture; and a step S505 of vacuum-drying the fourth mixture to obtain the thermally activated delayed fluorescent material.

15. The synthesizing method according to claim 14, wherein the high pressure reaction in the step S502 has a temperature of 65° C., a pressure of 2000 kPa, and a time of 24 hours.

16. The synthesizing method according to claim 15, wherein the first solvent in the step S503 is a mixture of methanol and acetone.

17. The synthesizing method according to claim 16, wherein the step S504 comprises: extracting the third mixture with n-hexane for 72 hours, and then extracting the third mixture with acetone for 72 hours.

* * * * *